US012632761B2

(12) United States Patent
Finck et al.

(10) Patent No.: US 12,632,761 B2
(45) Date of Patent: May 19, 2026

(54) CONTROLLING INTERACTION BETWEEN COUPLED SUPERCONDUCTING QUANTUM BITS

(71) Applicant: International Business Machines Corporation, Armonk, NY (US)

(72) Inventors: Aaron Finck, White Plains, NY (US); Cihan Kurter, White Plains, NY (US); Sarunya Bangsaruntip, Mount Kisco, NY (US); Harry Jonathon Mamin, Palo Alto, CA (US); Charles Thomas Rettner, San Jose, CA (US); John Blair, Katonah, NY (US); George Andrew Keefe, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 1015 days.

(21) Appl. No.: 17/836,268

(22) Filed: Jun. 9, 2022

(65) Prior Publication Data

US 2023/0401476 A1     Dec. 14, 2023

(51) Int. Cl.
    *G06N 10/40*      (2022.01)
    *G06N 10/20*      (2022.01)
    (Continued)

(52) U.S. Cl.
    CPC ............. *G06N 10/40* (2022.01); *G06N 10/20* (2022.01); *H10N 60/805* (2023.02); *H10N 60/84* (2023.02)

(58) Field of Classification Search
    CPC ...... G06N 10/40; G06N 10/20; H10N 60/805; H10N 60/84
    (Continued)

(56) References Cited

U.S. PATENT DOCUMENTS 9,685,935 B2    6/2017    Strand et al.
10,374,612 B1   8/2019    Sinclair et al.
              (Continued)

OTHER PUBLICATIONS

C. K. Andersen et al., "Entanglement Stabilization Using Ancilla-Based Parity Detection and Real-Time Feedback in Superconducting Circuits," NPJ Quantum Information, Aug. 15, 2019, pp. 1-7, vol. 5, No. 1.

(Continued)

*Primary Examiner* — Arnold M Kinkead
(74) *Attorney, Agent, or Firm* — Samuel Waldbaum; Ryan, Mason & Lewis, LLP

(57) ABSTRACT

A device comprises a first superconducting quantum bit, a second superconducting quantum bit, and a coupler circuit. The first superconducting quantum bit comprises a superconducting tunnel junction and a shunt inductor which form a first superconducting loop. The second superconducting quantum bit comprises a superconducting tunnel junction and a shunt inductor which form a second superconducting loop. The coupler circuit is coupled between the first and second superconducting quantum bits. The coupler circuit is configured to implement an entanglement gate operation between the first and second superconducting quantum bits through exchange interactions between the coupler circuit and the first superconducting quantum bit and the second superconducting quantum bit, when the coupler circuit is driven by a control signal. The coupler circuit is configured to suppress interaction between the first superconducting quantum bit and the second superconducting quantum bit, when the coupler circuit is not driven by the control signal.

20 Claims, 9 Drawing Sheets

(51) Int. Cl.
　　　H10N 60/80　　　　(2023.01)
　　　H10N 60/84　　　　(2023.01)
(58) Field of Classification Search
　　　USPC ............................. 326/1, 3, 4, 6, 5; 327/133
　　　See application file for complete search history.

(56)　　　　　　　References Cited

U.S. PATENT DOCUMENTS

| | | |
|---|---|---|
| 10,467,544 B2 | 11/2019 | Filipp et al. |
| 10,572,816 B1 | 2/2020 | Vavilov et al. |
| 10,573,685 B1 | 2/2020 | Adiga et al. |
| 10,957,737 B2 | 3/2021 | Adiga et al. |
| 12,301,225 B2 * | 5/2025 | Tsai ....................... H03K 17/92 |
| 2017/0193388 A1 | 7/2017 | Filipp et al. |
| 2021/0182728 A1 | 6/2021 | Neill et al. |
| 2021/0406746 A1 | 12/2021 | Stehlik et al. |
| 2021/0408112 A1 | 12/2021 | Finck et al. |
| 2021/0408113 A1 | 12/2021 | Finck et al. |
| 2023/0401475 A1 * | 12/2023 | Finck ................... H10N 60/128 |
| 2024/0070502 A1 † | 2/2024 | Ethier-Majcher |

OTHER PUBLICATIONS

B. Criger et al., "Quantum Error Correction with Mixed Ancilla Qubits," Physical Review A, arXiv:1201.1517v2, Mar. 8, 2012, 5 pages.

A. Kandala et al., "Demonstration of a High-Fidelity CNOT Gate for Fixed-Frequency Transmons with Engineered ZZ Suppression," Physical Review Letters, arXiv:2011.07050v1, Nov. 13, 2020, 10 pages.

P. Zhao et al., "Quantum Crosstalk Analysis for Simultaneous Gate Operations on Superconducting Qubits," PRX Quantum, Apr. 1, 2022, 21 pages, vol. 3, No. 020301.

L. Ding et al., "Microwave Activated Two-Qubit Gate for Fluxonium Qubits via a Tunable-Transmon Coupler," Bulletin of the American Physical Society, Abstract only, Mar. 14-18, 2022, 2 pages.

I. N. Moskalenko et al., "Tunable Coupling Scheme for Implementing Two-Qubit Gates on Fluxonium Qubits," Applied Physics Letters, arXiv:2107.11550v2, Sep. 26, 2021, 14 pages.

K. N. Nesterov et al., "Proposal for Entangling Gates on Fluxonium Qubits via a Two-Photon Transition," PRX Quantum vol. 2, No. 020345, Jun. 22, 2021, 15 pages.

A. D. K. Finck et al., "Suppressed Crosstalk Between Two-Junction Superconducting Qubits with Mode-Selective Exchange Coupling," Physical Review Applied, arXiv:2105.11495v2, Nov. 22, 2021, 7 pages.

H. Paik et al., "Experimental Demonstration of a Resonator-Induced Phase Gate in a Multi-Qubit Circuit QED System," Physical Review Letters, arXiv:1606.00685v1, Jun. 2, 2016, 13 pages.

Q. Ficheux et al., "Fast Logic with Slow Qubits: Microwave-Activated Controlled-Z gate on Low-Frequency Fluxoniums," Physical Review X, arXiv:2011.02634v1, Nov. 5, 2020, 17 pages.

H. S. Ku et al., "Qubit Gates Using Hyperbolic Secant Pulses," Physical Review A, arXiv:1704.00803v2, Apr. 5, 2017, 5 pages.

C. Chamberland et al., "Topological and Subsystem Codes on Low-degree Graphs with Flag Qubits," Physical Review X, vol. 10, No. 011022, Jan. 31, 2020, 19 pages.

J. M. Kreikebaum et al., "Improving Wafer-scale Josephson Junction Resistance Variation in Superconducting Quantum Coherent Circuits," Superconductor Science and Technology, vol. 33, No. 6, Apr. 29, 2020, 6 pages.

J. Stehlik et al., "Tunable Coupling Architecture for Fixed-Frequency Transmons," arXiv:2101.07746v1, Jan. 19, 2021, 7 pages.

P. Mundada et al., "Suppression of Qubit Crosstalk in a Tunable Coupling Superconducting Circuit," Physical Review Applied, arXiv:1810.04182v2, May 31, 2019, 11 pages.

B. Foxen et al., "Demonstrating a Continuous Set of Two-Qubit Gates for Near-Term Quantum Algorithms," Physical Review Letters, vol. 125, Sep. 15, 2020, 6 pages.

J. Stehlik et al., "Tunable Coupling Architecture for Fixed-frequency Transmon Superconducting Qubits," Physical Review Letters, vol. 127, Aug. 20, 2021, 6 pages.

F. Yan et al., "A Tunable Coupling Scheme for Implementing High-fidelity Two-Qubit Gates," Physical Review Applied, arXiv:1803.09813v1, Mar. 26, 2018, 10 pages.

M. Steffen et al., "Shaped Pulses for Quantum Computing," Physical Review A, vol. 75, No. 062326, Jun. 21, 2007, 4 pages.

P. Mell et al., "The NIST Definition of Cloud Computing," Recommendations of the National Institute of Standards and Technology, Special Publication 800-145, Sep. 2011, 7 pages.

PCT/EP2023/063642, EP, Jul. 6, 2023, International Search Report and Written Opinion.

Hayato Goto, "Double-Transmon Coupler: Fast Two-Qubit Gate with no Residual Coupling for Highly Detuned Superconducting Qubits," Cornell University Library, Mar. 22, 2022, 9 pages.

Y. Sung et al., "Realization of High-Fidelity CZ and ZZ-Free iSWAP Gates with a Tunable Coupler," Cornell University Library, Jun. 17, 2021, 34 pages.

Di Paolo et al. "Extensible circuit-QED architecture via amplitude- and frequency-variable microwaves", pp. 1-29; published online Apr. 19, 2022 available at https://arxiv.org/pdf/2204.08098.pdf.†

Moskalenko et al. "High fidelity two-qubit gate on fluxoniums using a tunable coupler", pp. 1-18; published Mar. 30, 2022 available at https://arxiv.org/pdf/2203.16302v1.pdf.†

\* cited by examiner
† cited by third party

100

200

300

400

500

600

700

710

701 Q1-Q2 STATIC ZZ
702 Q1-COUPLER CHI
703 Q2-COUPLER CHI

711 Q1-Q2 STATIC ZZ
712 Q1-COUPLER CHI
713 Q2-COUPLER CHI

CONTROLLING INTERACTION BETWEEN COUPLED SUPERCONDUCTING QUANTUM BITS

BACKGROUND

This disclosure relates generally to superconducting quantum computing and, in particular, superconducting quantum systems and devices that are implemented using superconducting quantum bits (qubits). A superconducting quantum computing system is implemented using circuit quantum electrodynamics (QED) devices, which utilize the quantum dynamics of electromagnetic fields in superconducting circuits, which include superconducting qubits, to generate and process quantum information. In general, superconducting qubits are electronic circuits which are implemented using components such as superconducting tunnel junctions (e.g., Josephson junctions), inductors, and/or capacitors, etc., and which behave as quantum mechanical anharmonic (non-linear) oscillators with quantized states, when cooled to cryogenic temperatures. A qubit can be effectively operated as a two-level system using a ground state and first excited state of the qubit due to the anharmonicity imparted by a non-linear inductor element (e.g., Josephson inductance) of the qubit, which allows the ground and first-excited states to be uniquely addressed at a transition frequency of the qubit, without significantly disturbing the higher-excited states of the qubit.

Various types of quantum information processing operations can be implemented using a superconducting quantum processor which comprises multiple superconducting qubits, wherein the superconducting qubits can be coherently controlled, placed into quantum superposition states (via, e.g., single-gate operations), exhibit quantum interference effects, and become entangled with one another (via, e.g., entanglement gate operations). The fidelity of quantum gate operations can be adversely impacted by unwanted crosstalk (e.g., residual static ZZ interactions) between adjacent superconducting qubits. For example, unwanted crosstalk between superconducting qubits can cause the transition frequency of one superconducting qubit to be dependent on the state of one or more neighboring superconducting qubits. As quantum processors are scaled with increasing numbers of superconducting qubits and higher integration densities, such unwanted crosstalk becomes increasingly problematic.

SUMMARY

Exemplary embodiments of the disclosure include quantum devices that are configured to control interaction (e.g., ZZ interactions) between coupled superconducting quantum bits.

In an exemplary embodiment, a device comprises a first superconducting quantum bit, a second superconducting quantum bit, and a coupler circuit. The first superconducting quantum bit comprises a superconducting tunnel junction and a shunt inductor which form a first superconducting loop. The second superconducting quantum bit comprising a superconducting tunnel junction and a shunt inductor which form a second superconducting loop. The coupler circuit is coupled between the first superconducting quantum bit and the second superconducting quantum bit. The coupler circuit is configured to implement an entanglement gate operation between the first superconducting quantum bit and the second superconducting quantum bit through exchange interactions between the coupler circuit and the first superconducting quantum bit and the second superconducting quantum bit, when the coupler circuit is driven by a control signal. The coupler circuit is configured to suppress interaction between the first superconducting quantum bit and the second superconducting quantum bit, when the coupler circuit is not driven by the control signal.

Advantageously, the coupling of the first and second superconducting quantum bits by a coupler circuit enables the implementation of a fast, high-fidelity two-qubit entanglement gate as a result of a relatively large amount of longitudinal coupling between the coupler circuit and the first and second superconducting quantum bits, which occurs when the coupler circuit is actively driven by a control signal. On the other hand, the coupler circuit serves to suppress crosstalk between the first and second superconducting quantum bits when the coupler circuit is not actively driven by a control signal.

In some embodiments, the coupler circuit comprises a third superconducting quantum bit (e.g., transmon quantum bit) comprising a superconducting tunnel junction and capacitor coupled in parallel between a first node and a second node of the coupler circuit. The third superconducting quantum bit is configured as a coupling bus between the first superconducting quantum bit and the second superconducting quantum bit. In some embodiments, the first superconducting quantum bit is coupled to the first node of the coupler circuit, and the second superconducting quantum bit is coupled to the second node of the coupler circuit.

In some embodiments, the coupler circuit comprises a superconducting resonator circuit comprising a superconducting inductor and capacitor coupled in parallel between a first node and a second node of the coupler circuit, where the first superconducting quantum bit is coupled to the first node of the coupler circuit, and the second superconducting quantum bit is coupled to the second node of the coupler circuit.

Another exemplary embodiment includes a system which comprises a quantum processor, and a control system. The quantum processor comprises an array of superconducting conducting quantum bits. The control system is configured to generate control signals to control the quantum processor. The array of superconducting quantum bits comprises a first superconducting quantum bit, a second superconducting quantum bit, and a coupler circuit. The first superconducting quantum bit comprises a superconducting tunnel junction and a shunt inductor which form a first superconducting loop. The second superconducting quantum bit comprises a superconducting tunnel junction and a shunt inductor which form a second superconducting loop. The coupler circuit is coupled between the first superconducting quantum bit and the second superconducting quantum bit. The coupler circuit is configured to implement an entanglement gate operation between the first superconducting quantum bit and the second superconducting quantum bit through exchange interactions between the coupler circuit and the first superconducting quantum bit and the second superconducting quantum bit, when the coupler circuit is driven by a control signal that is generated by the control system. The coupler circuit is configured to suppress interaction between the first superconducting quantum bit and the second superconducting quantum bit, when the coupler circuit is not driven by the control signal.

Another exemplary embodiment includes a device which comprises a first superconducting fluxonium quantum bit and a second superconducting fluxonium quantum bit coupled by an active coupler circuit. The active coupler circuit is driven by a control signal to control interaction between the first superconducting fluxonium quantum bit and the second superconducting fluxonium quantum bit.

Other embodiments will be described in the following detailed description of exemplary embodiments, which is to be read in conjunction with the accompanying figures.

BRIEF DESCRIPTION OF THE DRAWINGS

FIG. 10 schematically illustrates an exemplary architecture of a computing node which can host a quantum computing platform, according to an exemplary embodiment of the disclosure.

DETAILED DESCRIPTION

Figure 1:
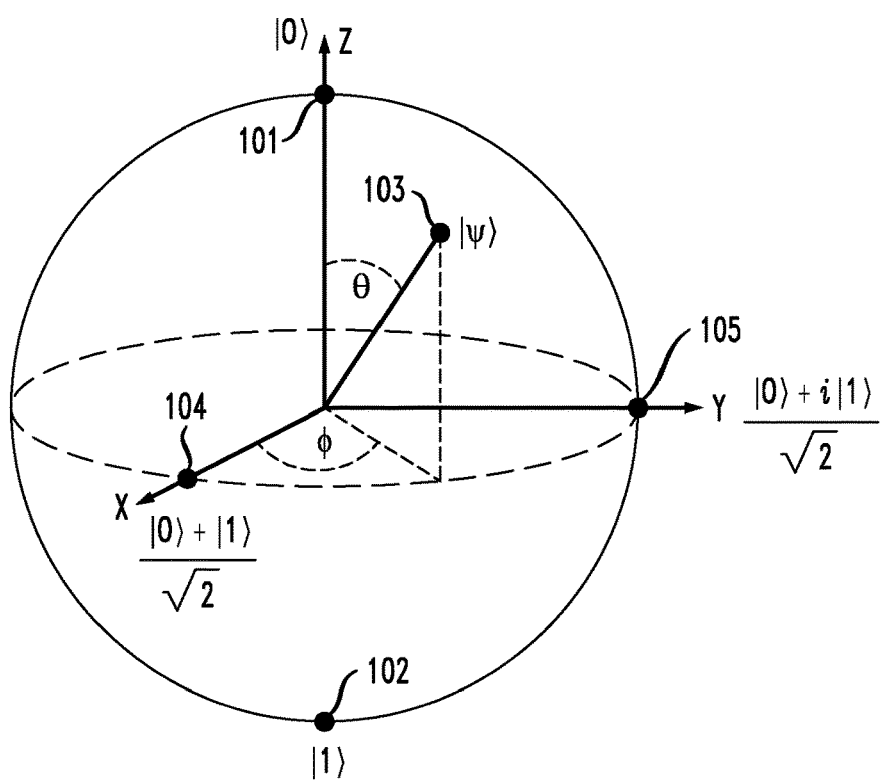
FIG. 1 depicts a Bloch sphere which graphically represents various states of a quantum bit.

Exemplary embodiments of the disclosure will now be described in further detail with regard to quantum devices that are configured to control interaction (e.g., ZZ interactions) between coupled superconducting qubits. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise quantum circuit elements (e.g., quantum bits, coupler circuitry, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

As is known in the art, quantum computing provides a computing paradigm which utilizes fundamental principles of quantum mechanics to perform computations. Quantum computing algorithms and applications are defined using quantum circuits. A quantum circuit is a computational routine which defines coherent quantum operations that are performed on quantum data that is stored in quantum bits, in conjunction with operations that are performed using classical computation. Quantum circuits are utilized to define complex algorithms and applications in an abstract manner, which can be executed on a quantum computer. In a quantum computer, primitive operations comprise gate operations (e.g., single-qubit gate operations, two-qubit gate operations, multi-qubit gate operations (e.g., 3 or more qubits) that are applied to qubits, to perform quantum computing operations for a given application. The quantum circuits allow a quantum computer to receive classical data, perform quantum operations based on the received data, and output a classical solution.

A single qubit can have a basis state of $|0\rangle$ or $|1\rangle$, or a linear combination of such basis states, which is known as a superposition state. As is known in the art, the state of a qubit can be graphically represented as a point on unit sphere (radius=1), which is called the Bloch sphere, such as illustrated in FIG. 1. In particular, FIG. 1 illustrates an exemplary Bloch sphere 100 in which the basis states $|0\rangle$ or $|1\rangle$ of a qubit are represented along the Z-axis of the Bloch sphere 100, wherein a point 101 on the positive Z-axis represents the ground state $|0\rangle$, and a point 102 on the negative Z-axis represents a first excited state $|1\rangle$ of the qubit. A superposition state $|\psi\rangle$ of the qubit can be represented as a point on the Bloch sphere as follows:

$$|\psi\rangle = \cos\frac{\theta}{2}|0\rangle + e^{i\phi}\sin\frac{\theta}{2}|1\rangle,$$

where the terms $$\cos\frac{\theta}{2} \text{ and } \sin\frac{\theta}{2}$$

correspond to the amplitude probabilities associated with the respective states $|0\rangle$ and $|1\rangle$, and wherein the term $e^{i\phi}$ corresponds to a relative phase between the states $|0\rangle$ and $|1\rangle$. The position of a point 103 (representing a super-position state of a qubit) is determined based on the angles $\theta$ and $\phi$. The angle $\theta$ influences the probability of observing a qubit state of $|0\rangle$ or $|1\rangle$ when the qubit is read, wherein the probability of reading a qubit state of $|1\rangle$ increases as $\theta$ increases. The angle $\phi$ influences the relative phase between the states $|0\rangle$ and $|1\rangle$. For example, when $\theta=0$, the qubit is in the ground state $|0\rangle$, which provides a 100% probability of observing a qubit state of $|0\rangle$ when the qubit state is read. In addition, when $\theta=\pi$, the qubit is in the first excited state $|1\rangle$, which provides a 100% probability of observing a qubit state of $|1\rangle$ when the qubit state is read. On the other hand, when $$\theta = \frac{\pi}{2}$$

and $\phi=0$, the qubit is in the state at point 104, and when $$\theta = \frac{\pi}{2} \text{ and } \phi = \frac{\pi}{2},$$

the qubit is in me state at point 105. When the qubit is in a superstition state represented by, e.g., points 104 and 105, there is a 50% probability of observing a qubit state of $|1\rangle$, and a 50% probability of observing a qubit state of $|0\rangle$, when the qubit state is read.

The state of a qubit can be changed by applying a single-qubit gate operation to the qubit, which causes the current state of the qubit to rotate around, e.g., the X-axis, Y-axis, X-Y axis, or Z-axis, etc., depending on the given gate operation. A rotation about the Z-axis results in a change in the angle $\phi$. In addition, qubits can be controlled using entanglement gate operations to entangle the states of two or more qubits and, thereby, generate a combined state of two or more qubits which contains more information than the individual states of the qubits.

As noted above, a superconducting quantum computing system can be implemented using superconducting qubits. For example, a superconducting fluxonium qubit is a type of superconducting qubit comprising a Josephson junction which is shunted by an inductor with a relatively large inductance, and a capacitor having a relatively small capacitance. Fluxonium qubits offer a promising alternative to other types of superconducting qubits, such as transmon qubits, because fluxonium qubits have higher anharmonicity and potentially higher coherence times than, e.g., transmon qubits. Indeed, in contrast to conventional superconducting transmon qubits, a superconducting fluxonium qubit has a highly anharmonic spectrum, in which the frequency separation between the computational states and the non-computational states, is relatively high, allowing efficient use of a superconducting fluxonium qubit as a two-level quantum system.

In particular, as is known in the art, the operating frequency of a superconducting qubit is the frequency that corresponds to a difference in the energy between the ground state $|0\rangle$ and the first excited state $|1\rangle$ of the qubit. With superconducting qubits, while higher energy levels are available for a given qubit, the quantum system is designed to isolate the two lowest energy levels and utilize each superconducting qubit as a basic two-level system, ignoring higher energy states. The term "anharmonicity" as used herein refers to a difference between (i) the frequency ($f_{01}$) to transition from the ground state $|0\rangle$ to the first excited state $|1\rangle$ and (ii) the frequency ($f_{12}$) to transition from first excited state $|1\rangle$ to the second excited state $|2\rangle$, of the qubit.

Despite the advantages associated with superconducting fluxonium qubits, it remains an open question on how implement a quantum computing architecture with low cross-talk between fluxonium qubits, and how to implement entanglement gates (e.g., two-qubit gates) between fluxonium qubits while controlling cross-talk and unwanted ZZ interactions between fluxonium qubits. As noted above, an entanglement gate is an operation in which external fields (e.g., RF signals) are applied to a quantum processor to create an entangled state between two or more separate qubits. For example, a controlled-phase gate (CPHASE gate) between two qubits is a type of entangling gate in which one qubit (e.g., target qubit) acquires a phase-shift if and only if both qubits are in their first excited state.

ZZ interaction is a type of longitudinal interaction between two qubits or modes, in which the excitation of one qubit or mode causes a shift in the transition frequency of the other qubit or mode. In certain instances, ZZ interaction provides a way to entangle two different qubits and create, e.g., a CPHASE gate, because a state-dependent shift in qubit frequency can be made equivalent to a state-dependent phase-shift. ZZ interactions are sometimes referred to as longitudinal coupling or denoted as chi or 2-chi coupling. On the other hand, in some instances, undesired ZZ interaction between two superconducting qubits is a source of crosstalk which can reduce the fidelity of gate operations.

For example, static ZZ interaction is a type of ZZ interaction that is present between two qubits or modes in the absence of any external RF drives. This "always-on" interaction comprises unwanted crosstalk, which can be detrimental to quantum system of qubits by inhibiting independent control of each qubit and by creating unwanted entanglement. In particular, static ZZ coupling can occur between neighboring qubits, wherein the state of one qubit affects the qubit frequency of an adjacent qubit, wherein the static ZZ coupling can lead to gate errors. In this regard, static ZZ interaction is a type of unwanted crosstalk between neighboring qubits, which can adversely impact the fidelity of single-qubit gate operations, which are calibrated under the assumption that the qubit frequency is fixed.

Another source of crosstalk between neighboring qubits includes exchange interactions that occur when a microwave pulse is applied to one qubit (such as for a single-qubit gate operation), which can potentially affect another neighboring qubit if there is an exchange interaction present between such neighboring qubits. For example, if exchange interaction exits between two qubits, applying microwave pulses to one qubit can conceivably excite the other qubit, which is a form of crosstalk that could be detrimental.

Exemplary embodiments of the disclosure will now be discussed with regard to techniques for implementing a scalable quantum computing architecture with fluxonium qubits that are coupled in a way to implement entanglement gate operations, while suppressing unwanted crosstalk between the coupled fluxonium qubits, e.g., suppressing static ZZ interactions between the coupled fluxonium qubits, and suppressing exchange interactions between the coupled fluxonium qubits when performing a single-gate operation on one of the coupled fluxonium qubits.

Figure 2:
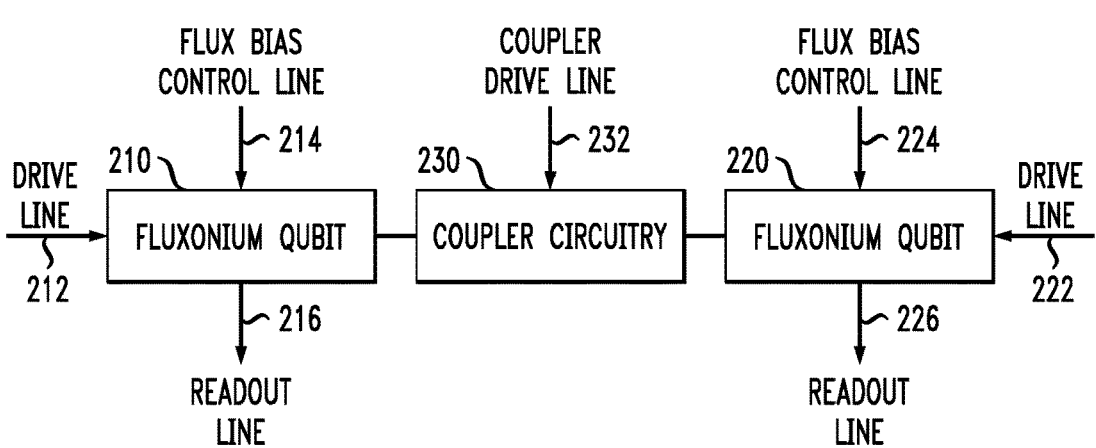
FIG. 2 schematically illustrates a quantum device comprising superconducting quantum bits that are coupled by a coupler circuit which is configured to control ZZ interactions between the quantum bits, according to an exemplary embodiment of the disclosure.

FIG. 2 schematically illustrates a quantum device comprising superconducting quantum bits that are coupled by a coupler circuit which is configured to control ZZ interactions between the quantum bits, according to an exemplary embodiment of the disclosure. In particular, FIG. 2 schematically illustrates a quantum device 200 comprising a first superconducting quantum bit 210 (or first qubit 210), a second superconducting quantum bit 220 (or second qubit 220), and coupler circuitry 230. In the exemplary configuration, the first and second qubits 210 and 220 comprise computational qubits, and the coupler circuitry 230 is configured to mediate the interaction strength (e.g., ZZ interaction) between the first and second qubits 210 and 220 under different gate operations. As explained in further detail below, in some embodiments, the first and second qubits 210 and 220 comprise superconducting fluxonium qubits. The quantum device 200 further comprises a plurality of control lines (e.g., transmission line resonators) including, but not limited to, qubit drive lines 212 and 222, flux bias control lines 214 and 224, qubit readout lines 216 and 226, and a coupler drive line 232.

In some embodiments, the qubit drive lines 212 and 222 are coupled (e.g., capacitively coupled via capacitors) to the first and second qubits 210 and 220, respectively. In some embodiments, the qubit drive lines 212 and 222 are configured to apply control signals (e.g., microwave pulse signals) to independently change the states of the respective first and second qubits 210 and 220 (e.g., single-qubit gate operations). As is known in the art, the state of a qubit can be changed by applying a microwave control signal (e.g., control pulse) with a center frequency equal to a transition frequency (denoted $f_{01}$) of the qubit, wherein the transition frequency $f_{01}$ corresponds to an energy difference between the ground state $|0\rangle$ and excited state $|1\rangle$ of the qubit. In addition, the axis of rotation about a given axis of the Bloch sphere 100 (e.g., X-axis and/or Y-axis) and the amount (angle) of such rotation are based, respectively, on the phase of the microwave control signal, and the amplitude and duration of the microwave control signal.

Further, in some embodiments, the flux bias control lines 214 and 224 are coupled (e.g., inductively coupled) to the first and second qubits 210 and 220, respectively. In some embodiments, the flux bias control lines 214 and 224 are configured to apply flux bias control signals to change an amount of bias flux that is applied to superconducting loops of the respective first and second qubits 210 and 220 to control/adjust the transition frequency $f_{01}$ of the first and second qubits 210 and 220. More specifically, when a flux bias control pulse is applied to a given flux bias control line, the transition frequency of the qubit is detuned from the base transition frequency for the duration of the flux bias control pulse.

In embodiments where the first and second qubits 210 and 220 are implemented using fluxonium qubits, the flus bias control pulses are applied during an entanglement gate operation (e.g., CPHASE gate) to bias the first and second qubits 210 and 220 at the half-integer magnetic flux quantum, i.e., $0.5\Phi_0$, where $\Phi_0 = h/(2e) \approx 2.07 \times 10^{-15}$ weber, where h is Planck's constant, and e denotes a magnitude of electron charge. As is known in the art, magnetic flux quantum (Do is a fundamental unit of magnetic flux which represents a quantization of magnetic flux threading a superconducting loop. In some embodiments, applying magnetic flux, which is equal to about one-half the quantum of magnetic flux (i.e., about $0.5\Phi_0$) in a superconductor, to a superconducting loop enclosed by a Josephson junction and super inductor of a given fluxonium qubit, results in a reduction of the energy of the first excited state of the fluxonium qubits (e.g., reduced to less than 1 GHz) such that the energy becomes fluxon-like, causing an increase in $T_1$ lifetime. Here, $T_1$ denotes a coherence time of the qubit, which is the time it takes for the qubit state to decay from the excited state to the ground state.

Further, in some embodiments, the qubit readout lines 216 and 226 are coupled to the first and second qubits 210 and 220, respectively, using known techniques. In some embodiments, the qubit readout lines 216 and 226 comprise transmission line readout resonators (e.g., coplanar transmission lines) which are configured to have resonant frequencies that are detuned from the respective transition frequencies of the respective first and second qubits 210 and 220. Due to the coupling of the qubit readout lines 216 and 226 to the respective first and second qubits 210 and 220, there is a shift in the resonant frequencies of transmission line readout resonators depending on the states of the respective first and second qubits 210 and 220. The change in resonant frequency of the transmission line readout resonator, which is coupled to a given qubit, is utilized to determine a readout state of the given qubit, e.g., ground state $|0\rangle$ or excited state $|1\rangle$, wherein for readout, superposition states of the given qubit are projected onto one of the ground state or excited state of the qubit, as is known in the art.

The coupler drive line 232 is coupled (e.g., capacitively coupled or inductively coupled) to the coupler circuitry 230. In some embodiments, the coupler circuitry 230 comprises a superconducting transmon (transmission line shunted plasma oscillation) qubit which is configured to have a transition frequency that is detuned from the transition frequencies of the first and second qubits 210 and 220. In other embodiments, the coupler circuitry 230 comprises a superconducting LC resonator coupler circuit which is configured to have resonant frequency that is detuned from the transition frequencies of the first and second qubits 210 and 220. The coupler circuitry 230 is configured to control longitudinal interaction (e.g., ZZ interaction) between the first and second qubits 210 and 220 for different operating conditions (e.g., gate operations) in response to drive signals applied to the coupler circuitry 230 via the coupler drive line 232.

For example, to perform an entanglement gate operation, the coupler circuitry 230 is driven by a control signal applied to the coupler drive line 232, wherein the control signal has a frequency that is near, e.g., a transition frequency or resonant frequency, of the coupler circuitry 230. The control signal applied to the coupler circuitry 230 causes a relatively large amount of longitudinal coupling between the coupler circuitry 230 and the first and second qubits 210 and 220 due to higher energy excitations in the qubits 210 and 220 and coupler circuitry 230, which are at similar energies. The longitudinal coupling between the coupler circuitry 230 and the first and second qubits 210 and 220 causes a state-dependent AC-Stark shifting of the transition frequencies of the first and second qubits 210 and 220, wherein the Stark shifting of the frequency of a given qubit is a function of, e.g., (i) a coupling strength between the coupler circuitry 230 and the given qubit, and (ii) an amount of detuning between the operating frequency of the coupler circuitry the operating frequency given qubit.

The longitudinal coupling between the coupler circuitry 230 and the first and second qubits 210 and 220 enables entanglement of the first and second qubits 210 and 220 to create, e.g., CPHASE gate as a result of a state-dependent shift in qubit frequency which corresponds to a state-dependent phase-shift. The net result is that a state of at least one of the qubits will undergo a rotation (phase shift) about a Z-axis depending on the state of the other qubit. In this regard, actively driving the coupler circuitry 230 enables implementation of a two-qubit gate operation between the first and second qubits 210 and 220 as result of the state-dependent AC-Stark shifting of the qubits 210 and 220.

On the other hand, there is a suppressed residual longitudinal coupling (e.g., suppressed static ZZ interaction) between modes of the first and second qubits 210 and 220 due to a relatively large detuning between the operating frequency of the coupler circuitry 230 and the operating frequencies of the first and second qubits 210 and 220. In other words, the detuning between the coupler circuitry 230 and the first and second qubits 210 and 220 serves to significantly suppress any direct longitudinal coupling between the first and second qubits 210 and 220 and, thus, the state of one qubit will not affect the transition frequency of the other qubit. In this regard, when the coupler circuitry 230 is not driven by a control signal on the coupler drive line 232, the first and second qubits 210 and 220 are essentially decoupled with substantially no quantum cross-talk between first and second qubits 210 and 220. This allows single-qubit gate operations to be independently performed on the first and second qubits 210 and 220 without the inducement of coherent errors during such single-qubit gate operations that may otherwise result from the ZZ interaction or direct exchange interactions between the first and second qubits 210 and 220. Accordingly, the suppression of crosstalk (e.g., ZZ interactions) achieved using the configuration of FIG. 2 allows calibration of single-qubit gate operations based on the known fixed transition frequencies of the first and second qubits 210 and 220.

Figure 3:
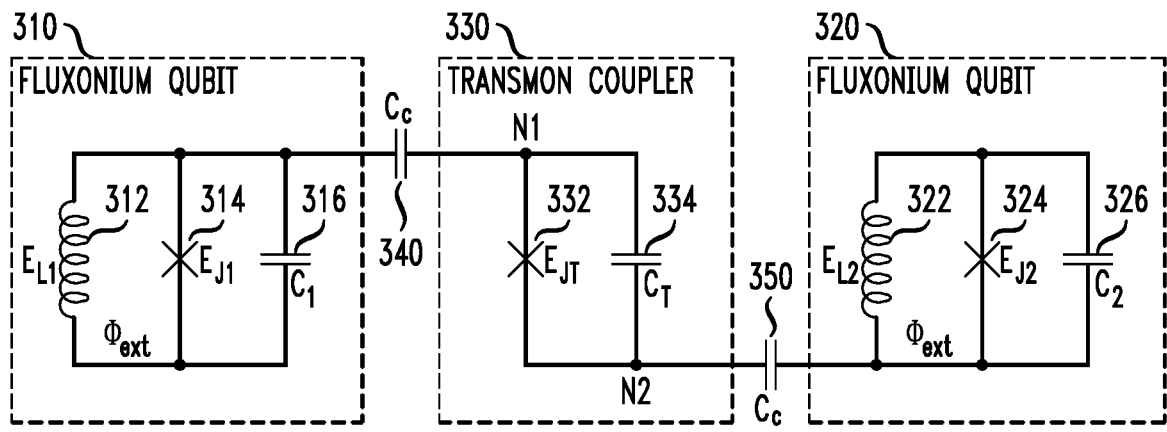
FIG. 3 schematically illustrates a circuit diagram of the quantum device of FIG. 2, according to an exemplary embodiment of the disclosure.

The quantum device 200 of FIG. 2 can be implemented using different circuit architectures, exemplary embodiments of which will now be described in further detail in conjunction with FIGS. 3, 4, 5, and 6. For example, FIG. 3 schematically illustrates a circuit diagram of the quantum device 200 of FIG. 2, according to an exemplary embodiment of the disclosure. More specifically, FIG. 3 is a schematic lumped-element circuit representation of a superconducting quantum circuit 300 comprising a first superconducting fluxonium qubit 310, a second superconducting fluxonium qubit 320, a superconducting transmon qubit coupler 330 (alternatively, transmon bus 330), a first coupling capacitor 340, and a second coupling capacitor 350. FIG. 3 illustrates an exemplary embodiment of the quantum device 200 of FIG. 2, wherein the first and second qubits 210 and 220 are implemented by the first and second fluxonium qubits 310 and 320, and wherein the coupler circuitry 230 is implemented by the transmon qubit coupler 330 and the first and second coupling capacitors 340 and 350. In this regard, FIG. 3 schematically illustrates an exemplary superconducting quantum circuit configuration comprising a pair of superconducting fluxonium qubits which are capacitively coupled to a superconducting transmon qubit that is configured to operate as a superconducting coupling bus.

The first fluxonium qubit 310 comprises a super-inductor 312 with energy $E_{L1}$, a superconducting tunnel junction (e.g., Josephson junction 314) with energy $E_{J1}$, and a capacitor 316 with capacitance $C_1$, wherein the Josephson junction 314 is shunted by the super-inductor 312 and the capacitor 316. Similarly, the second fluxonium qubit 320 comprises a super-inductor 322 with energy $E_{L2}$, a superconducting tunnel junction (e.g., Josephson junction 324) with energy $E_{J2}$, and a capacitor 326 with capacitance $C_2$, wherein the Josephson junction 324 is shunted by the super-inductor 322 and the capacitor 326. The Josephson junctions 314 and 324 comprise a small junction capacitance $C_{J1}$ and $C_{J2}$, respectively, which are omitted from FIG. 3 for ease of illustration. The capacitances $C_1$ and $C_2$ of the respective capacitors 316 and 326 are large relative to the junction capacitances $C_{J1}$ and $C_{J2}$ of the respective Josephson junctions 314 and 324. In some embodiments, the super-inductors 312 and 322 of the respective first and second fluxonium qubits 310 and 320 each comprise a serially connected chain of relatively large identical Josephson junctions (e.g., 100 Josephson junctions).

The superconducting transmon qubit coupler 330 comprises a superconducting transmon qubit comprising a superconducting tunnel junction (e.g., Josephson junction 332) with energy $E_{JT}$ (and with small junction capacitance $C_{JT}$ not shown), and a shunting capacitor 334 with a capacitance $C_T$. The Josephson junction 332 and the shunting capacitor 334 are connected in parallel between a first node N1 and a second node N2 of the transmon qubit coupler 330. The first coupling capacitor 340 is configured to capacitively couple the first fluxonium qubit 310 to the first node N1 of the transmon qubit coupler 330. The second coupling capacitor 350 is configured to capacitively couple the second fluxonium qubit 320 to the second node N2 of the transmon qubit coupler 330.

FIG. 3 schematically illustrates an exemplary circuit configuration which enables the implementation of two-qubit gate interaction between a pair of fluxonium qubits while substantially suppressing or substantially eliminating crosstalk between the fluxonium qubits 310 and 320 as a result of utilizing the transmon qubit coupler 330, and operating the fluxonium qubits 310 and 320 in a given regime by applying an external magnetic flux $\Phi_{ext}$ to the superconducting loops enclosed by Josephson junction and super-inductor of each fluxonium qubit, using known techniques. For example, as noted above, in some embodiments, the external magnetic flux $\Phi_{ext}$ that is applied to the superconducting loops of the first and second fluxonium qubits 310 and 320 is equal to a half-integer magnetic flux quantum, i.e., $\Phi_{ext}$=0.5 (Do. In some embodiments, applying $\Phi_{ext}$=0.5 $\Phi_0$ to each superconducting loop of the fluxonium qubits 310 and 320 causes the energies of first excited states of the fluxonium qubits 310 and 320 to be reduced to less than 1 GHz and become fluxon-like, causing a rise in Ti lifetime.

When the transmon qubit coupler 330 is driven by a RF control signal having a frequency near the transition frequency of the transmon qubit coupler 330 (e.g., a fixed transition frequency in a range of about 5 GHz to about 7 GHz), the qubit modes of the fluxonium qubits 310 and 320 will have a large amount of longitudinal coupling to the transmon qubit coupler 330 due to the interaction of higher energy plasmon-like excitations in the fluxonium qubits 310 and 320 and the plasmon-like excitations in the transmon qubit coupler 330 that are at similar energies. The longitudinal coupling between the transmon qubit coupler 330 and the fluxonium qubits 310 and 320 causes a state-dependent Stark shifting of the fluxonium qubits 310 and 320 which, in turn, enables the implementation of a two-qubit gate operation (e.g., CPHASE gate) between the fluxonium qubits 310 and 320. On the other hand, due to the large detuning between the transition frequency of the transmon qubit coupler 330 and the transition frequencies of the fluxonium qubits 310 and 320, there a substantial suppression of static ZZ coupling between the fluxonium qubit modes when the transmon qubit coupler 330 is in an idle state with no microwave pulse applied to the transmon qubit coupler 330.

In some embodiments, to perform an entanglement gate operation, a suitably calibrated control pulse is applied to the transmon qubit coupler 330 through a coupler drive line that is capacitively coupled to, e.g., the first node N1 of the transmon qubit coupler 330 to drive the transmon qubit coupler 330 through a full $2\pi$ rotation around the X-axis of the Bloch sphere (e.g., from ground state |0) to the first excited state |1), and back to the ground state |0) ). This full $2\pi$ rotation causes the first and second fluxonium qubits 310 and 320 to be exchanged coupled to the transmon qubit coupler 330 and exchange energy to thereby enable inter-action between the first and second fluxonium qubits 310 and 320 and perform an entanglement gate operation. During an idle state, when no calibrated microwave control pulse is applied to drive the transmon qubit coupler 330, the transmon qubit coupler 330 is in or near the ground state |0), which serves to suppress static ZZ interaction between the first and second fluxonium qubits 310 and 320.

Figure 4:
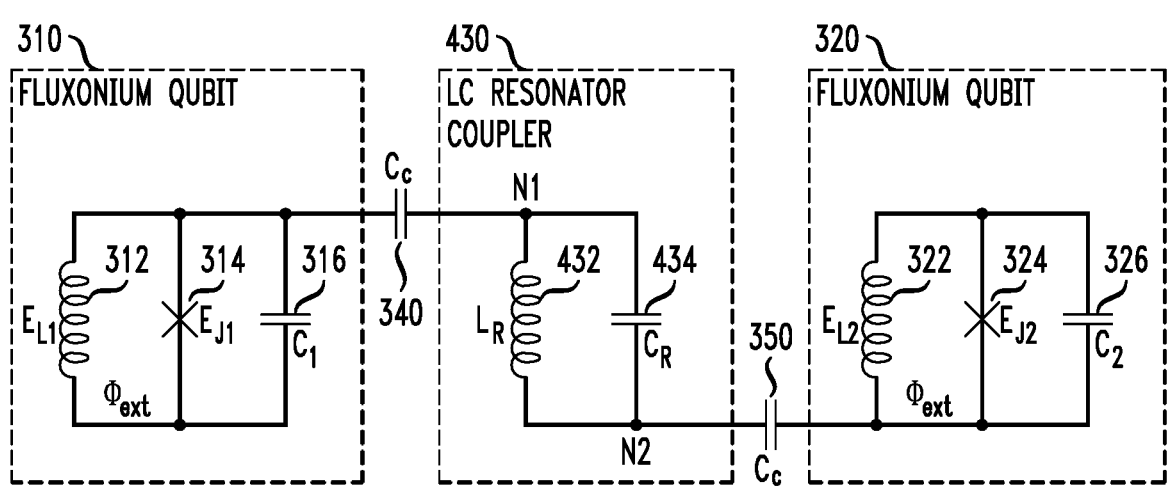
FIG. 4 schematically illustrates a circuit diagram of the quantum device of FIG. 2, according to another exemplary embodiment of the disclosure.

Next, FIG. 4 schematically illustrates a circuit diagram of the quantum device 200 of FIG. 2, according to another exemplary embodiment of the disclosure. More specifically, FIG. 4 is a schematic lumped-element circuit representation of a superconducting quantum circuit 400 which is similar to the superconducting quantum circuit 300 of FIG. 3, except that the first and second fluxonium qubits 310 and 320 are capacitively coupled to a superconducting LC resonator coupler 430, which serves as a coupling bus. The supercon-ducting LC resonator coupler 430 comprises an inductor 432 with an inductance $L_R$, and a capacitor 434 with a capaci-tance $C_R$, providing an LC tank circuit coupled between a first tank node N1 and a second tank node N2. The super-conducting LC resonator coupler 430 has resonant fre-quency f that is generally expressed by:

$$f = \frac{1}{2\pi\sqrt{LC}}.$$

As compared to me transmon qubit coupler 330 (FIG. 3) with a Josephson junction having a non-linear Josephson junction of energy EJ, the superconducting LC resonator coupler 430 comprises a linear inductance resulting in a quantum harmonic oscillator with energy levels that are equidistantly spaced apart.

FIG. 4 schematically illustrates an exemplary circuit configuration which operates similar to the exemplary embodiment of FIG. 3, to enable the implementation of two-qubit gate interaction between a pair of fluxonium qubits while substantially suppressing or substantially elimi-nating crosstalk between the fluxonium qubits 310 and 320 as a result of utilizing the superconducting LC resonator coupler 430. More specifically, in some embodiments, the superconducting quantum circuit 400 is configured to con-trol crosstalk by operating the first and second fluxonium qubits 310 and 320 in a given regime by applying an external magnetic flux, e.g., $\Phi_{ext}=0.5\ \Phi_0$, to each superconducting loop enclosed by the Josephson junction and super-inductor of each fluxonium qubit, and driving the superconducting LC resonator coupler 430 with a microwave control signal having a frequency near the resonant frequency of the superconducting LC resonator coupler 430 (e.g., a fixed resonant frequency in a range of about 5 GHz to about 7 GHz) to longitudinally couple the qubit modes of the fluxonium qubits 310 and 320 to the superconducting LC resonator coupler 430. The longitudinal coupling between the superconducting LC resonator coupler 430 and the fluxonium qubits 310 and 320 causes a state-dependent Stark shifting of the fluxonium qubits 310 and 320 which, in turn, enables the implementation of a two-qubit gate opera-tion between the fluxonium qubits 310 and 320. On the other hand, due to the large detuning between the resonant fre-quency of the superconducting LC resonator coupler 430 and the transition frequencies of the fluxonium qubits 310 and 320, there is a substantial suppression of static ZZ coupling between the fluxonium qubit modes.

The exemplary superconducting quantum circuits shown in FIGS. 3 and 4 can be implemented using planar micro-wave circuit elements that are formed on a substrate (e.g., silicon substrate) using state-of-the-art semiconductor fab-rication techniques and materials. For example, the various components of the superconducting qubits (e.g., Josephson tunnel junction devices, inductors, capacitors), intercon-nects, coupling circuitry, flux bias lines, qubit drive lines, and the state readout lines, etc., comprise lithographically defined patterns of superconducting materials formed on semiconductor substrate. The circuit elements can be formed using various types of superconductor materials that are suitable for a given application, including, but not limited to, elementary metals such as niobium (Nb), aluminum (Al), tantalum (Ta), and compound such as titanium nitride (TiN), niobium nitride (NbN), niobium titanium nitride (NbTiN), etc. A Josephson tunnel junction device comprises two superconducting electrodes that are separated by a thin insulating barrier. For example, a Josephson tunnel junction device for a superconducting qubit may comprise an Al—AlO$_x$—Al trilayer tunnel junction that is fabricated using a double-angle evaporation technique, or other suitable fab-rication techniques.

Figures 5, 6:
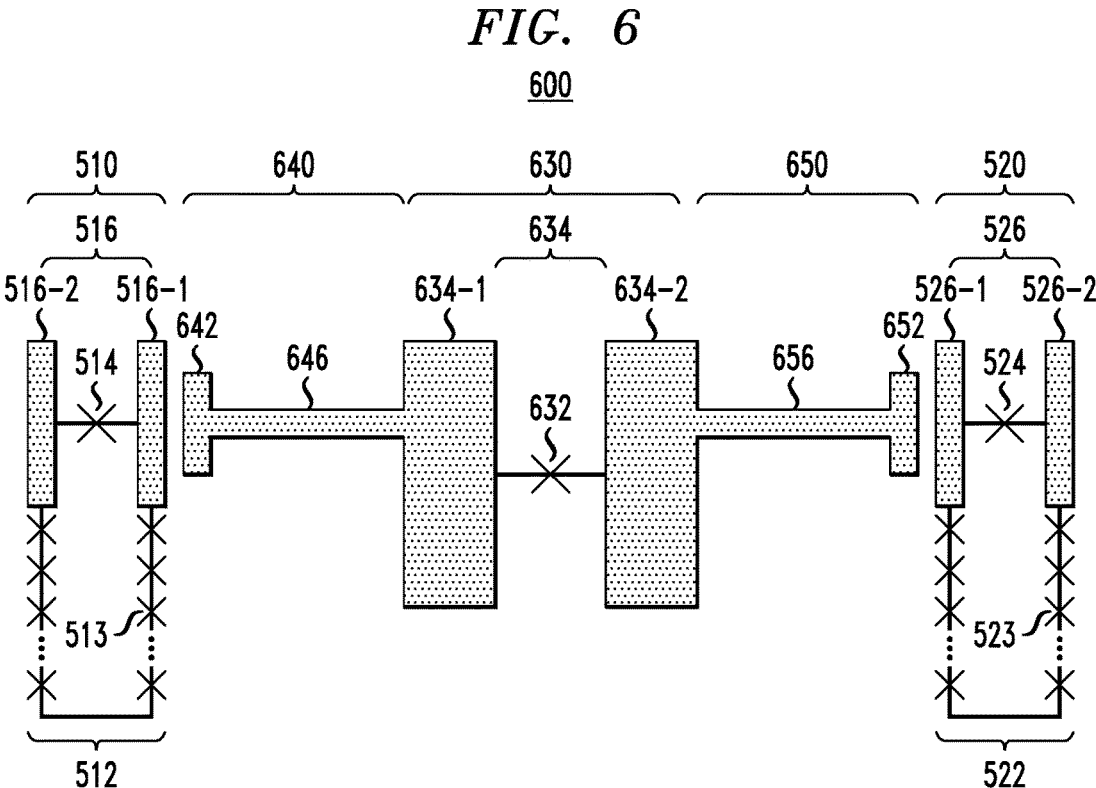
FIG. 5 schematically illustrates a planar circuit configuration of the superconducting quantum circuit of FIG. 3, according to an exemplary embodiment of the disclosure.
FIG. 6 schematically illustrates a planar circuit configuration of the superconducting quantum circuit of FIG. 3, according to an exemplary embodiment of the disclosure.

FIG. 5 schematically illustrates a planar circuit configu-ration of the superconducting quantum circuit 300 of FIG. 3, according to an exemplary embodiment of the disclosure. More specifically, FIG. 5 schematically illustrates a planar superconducting quantum circuit 500 comprising a first superconducting fluxonium qubit 510, a second supercon-ducting fluxonium qubit 520, a superconducting transmon qubit coupler 530, a first superconducting coupling capacitor 540, and a second superconducting coupling capacitor 550. The first superconducting fluxonium qubit 510 comprises a super-inductor 512, a Josephson junction device 514, and a capacitor 516. Similarly, the second superconducting fluxo-nium qubit 520 comprises a super-inductor 522, a Josephson junction device 524, and a capacitor 526. The superconduct-ing transmon qubit coupler 530 comprises a Josephson junction device 532 and a capacitor 534 (or transmon capacitor 534). The first superconducting coupling capacitor 540 comprises superconducting pads 542 and 544 (or super-conducting coupling electrodes 542 and 544) that are con-nected by a superconducting planar transmission line 546 (e.g., coplanar waveguide). Similarly, the second supercon-ducting coupling capacitor 550 comprises superconducting pads 552 and 554 (or coupling electrodes) that are connected by a superconducting planar transmission line 556 (e.g., coplanar waveguide).

In the first superconducting fluxonium qubit 510, in some embodiments, the capacitor 516 comprises a coplanar par-allel-plate capacitor structure comprising a first supercon-ducting electrode 516-1, and a second superconducting electrode 516-2. The Josephson junction device 514 com-prises first and second superconducting electrodes that are coupled to the first and second superconducting electrodes 516-1 and 516-2, respectively, of the capacitor 516. In some embodiments, as schematically illustrated in FIG. 5, the Josephson junction device 514 is disposed between the first and second superconducting electrodes 516-1 and 516-2 of the capacitor 516. In some embodiments, as schematically illustrated in FIG. 5, the super-inductor 512 comprises a serial chain of n of identical Josephson junction devices 513 (e.g., n=100) coupled to the first and second superconducting electrodes 516-1 and 516-2 of the capacitor 516. In other embodiments, the super-inductor 512 can be implemented using a printed superconductor meander-wire inductor structure.

Similarly, in the second superconducting fluxonium qubit 520, in some embodiments, the capacitor 526 comprises a coplanar parallel-plate capacitor structure comprising a first superconducting electrode 526-1, and a second superconducting electrode 526-2. The Josephson junction device 524 comprises first and second superconducting electrodes that are coupled to the first and second superconducting electrodes 526-1 and 526-2, respectively, of the capacitor 526. In some embodiments, the Josephson junction device 524 is disposed between the first and second superconducting electrodes 526-1 and 526-2 of the capacitor 526. In some embodiments, the super-inductor 522 comprises a serial chain of n of identical Josephson junction devices 523 (e.g., n=100) coupled to the first and second superconducting electrodes 526-1 and 526-2 of the capacitor 526. In other embodiments, the super-inductor 522 can be implemented using a printed superconductor meander-wire inductor structure.

In the superconducting transmon qubit coupler 530, in some embodiments, the capacitor 534 comprises a coplanar parallel-plate capacitor structure comprising a first superconducting electrode 534-1, and a second superconducting electrode 534-2. The Josephson junction device 532 comprises first and second superconducting electrodes that are coupled to the first and second superconducting electrodes 534-1 and 534-2, respectively, of the capacitor 534. In some embodiments, as schematically illustrated in FIG. 5, the Josephson junction device 532 is disposed between the first and second superconducting electrodes 534-1 and 534-2 of the capacitor 534.

The first superconducting coupling capacitor 540 is configured to capacitively couple the first superconducting fluxonium qubit 510 to the superconducting transmon qubit coupler 530. In some embodiments, as schematically illustrated in FIG. 5, the capacitive coupling is achieved by a combination of (i) the capacitive coupling between the superconducting electrode 516-1 of the capacitor 516, and the superconducting coupling electrode 542 of the first superconducting coupling capacitor 540, (ii) the capacitive coupling between the superconducting electrode 534-1 of the transmon capacitor 534 and the superconducting coupling electrode 544 of the first superconducting coupling capacitor 540, and (iii) the distributed capacitance of the planar transmission line 546, providing a net coupling capacitance $Cc_{1\_}$ net.

Similarly, the second superconducting coupling capacitor 550 is configured to capacitively couple the second superconducting fluxonium qubit 520 to the superconducting transmon qubit coupler 530. In some embodiments, as schematically illustrated in FIG. 5, the capacitive coupling is achieved by a combination of (i) the capacitive coupling between the superconducting electrode 526-1 of the capacitor 526 and the superconducting coupling electrode 552 of the second superconducting coupling capacitor 550, (ii) the capacitive coupling between the superconducting electrode 534-2 of the transmon capacitor 534 and the superconducting coupling electrode 554 of the second superconducting coupling capacitor 550, and (iii) the distributed capacitance of the planar transmission line 556, providing a net coupling capacitance $Cc_{2\_}$net.

The various superconducting circuit elements of the planar superconducting quantum circuit 500 in FIG. 5 can be configured to achieve desired operating characteristics. For example, a Josephson junction comprises an inductance $L_J$, and capacitance $C_J$ (where $C_J$ exists by virtue of the parallel-plate structure of the Josephson junction). The inductance $L_J$ of a Josephson junction is non-linear in the superconducting phase difference $\varphi = \varphi_1 - \varphi_2$ across the junction. The non-linearity of the junction inductance $L_J$ in conjunction with the junction capacitance $C_J$ results in the Josephson junction acting as an anharmonic oscillator, which allows a superconducting qubit to effectively operate as a two-level system (e.g., ground state and first excited state). In other words, due to the anharmonicity imparted by the Josephson junction, the ground and first excited state of a given qubit can be uniquely addressable at a given transition frequency, $f_{01}$, without significantly perturbing the higher-excited states of the superconducting qubit.

For a Josephson junction, a resulting superconducting current I which flows through the junction, and junction voltage V across the junction, are related to the superconducting phase difference $\varphi = \varphi_1 - \varphi_2$ as follows: $I = I_c \sin \varphi$, and $$V = \frac{\Phi_0 d\varphi}{2\pi dt},$$

where $I_c$ denotes a junction critical current, and where $$\Phi_0 = \frac{h}{2e}.$$

The junction critical current is determined by $$I_c = \frac{2eE_J}{h},$$

wherein the junction critical current $I_c$ denotes a maximum amount of current that can coherently tunnel through the junction (exhibiting no dissipation). The junction critical current $I_c$ is a function of the Josephson energy $E_J$ of the Josephson junction, wherein $$E_J = L_J I_C^2,$$

wherein $L_J$ denotes the Josephson inductance the Josephson junction. Based on the standard relation for inductance $$V = L_J \left( \frac{dI}{dt} \right),$$

the Josephson inductance $L_j$ is determined as:

$$L_J = \frac{\Phi_0}{2\pi I_c \cos\varphi},$$

which shows that $L_j$ is non-linear with respect to $\varphi$.

In view of the above, the Josephson junction devices of the superconducting fluxonium qubits 510 and 520 and the transmon qubit coupler 530 can be designed to have, e.g., respective target critical currents $I_c$ and Josephson energies $E_J$, etc., to achieve a given anharmonicity for the qubit potential. Moreover, the values of the external shunted inductors and/or capacitors of the superconducting fluxonium qubits 510 and 520 and the transmon qubit coupler 530 can be selected to achieve desired transition frequencies and other operating characteristics. Moreover, the first and second superconducting coupling capacitors 540 and 550 can have net coupling capacitances $Cc_1\_net$ and $Cc_2\_net$ to achieve a desired amount of exchange coupling between the superconducting transmon qubit coupler 530 and each of the superconducting fluxonium qubits 510 and 520.

Next, FIG. 6 schematically illustrates a planar circuit configuration of the superconducting quantum circuit 300 of FIG. 3, according to another exemplary embodiment of the disclosure. More specifically, FIG. 6 schematically illustrates a planar superconducting quantum circuit 600 which is similar to the planar superconducting quantum circuit 500 of FIG. 5 with respect to the first and second superconducting fluxonium qubits 510 and 520. However, the planar superconducting quantum circuit 600 comprises a superconducting transmon qubit coupler 630, and first and second coupling capacitors 640 and 650 which vary in structure from the superconducting transmon qubit coupler 530 and first and second superconducting coupling capacitors 540 and 550 as shown in FIG. 5, to provide an exemplary configuration in which the superconducting transmon qubit coupler 630 is essentially directly coupled to the first and second superconducting fluxonium qubits 510 and 520.

In particular, as shown in FIG. 6, the superconducting transmon qubit coupler 630 comprises a Josephson junction device 632, and a capacitor 634 (transmon shunt capacitor 634). The capacitor 634 comprises a coplanar parallel-plate capacitor structure comprising a first superconducting electrode 634-1, and a second superconducting electrode 634-2. The first coupling capacitor 640 comprises a superconducting pad 642 (or superconducting coupling electrode), and a superconducting planar transmission line 646 (e.g., coplanar waveguide). Similarly, the second coupling capacitor 650 comprises a superconducting pad 652 (or superconducting coupling electrode) and a superconducting planar transmission line 656 (e.g., coplanar waveguide).

In the exemplary embodiment of FIG. 6, the first and second superconducting electrodes 634-1 and 634-2 of the transmon shunt capacitor 634 are directly connected to the respective superconducting planar transmission lines 646 and 656 of the respective first and second coupling capacitors 640 and 650 (as opposed to capacitively coupled as in the exemplary embodiment of FIG. 5). The exemplary configuration of FIG. 6 provides an increased coupling of the first and second superconducting fluxonium qubits 510 and 520 to the superconducting transmon qubit coupler 630, but at the expense of an increase in the capacitance of the transmon shunt capacitor 634 of the superconducting transmon qubit coupler 630, which can result in a decrease in the anharmonicity of the superconducting transmon qubit coupler 630. In the exemplary embodiment of FIG. 5, the superconducting coupling electrodes 544 and 554 of the respective first and second superconducting coupling capacitors 540 and 550 serve to mediate the capacitive coupling between the superconducting transmon qubit coupler 530 and the first and second superconducting fluxonium qubits 510 and 520.

In another exemplary embodiment, a planar circuit configuration of the superconducting quantum circuit 400 of FIG. 4, which comprises the superconducting LC resonator coupler 430, may be implemented using a similar configuration of the first and second superconducting fluxonium qubits 510 and 520 as shown in FIGS. 5 and 6. In such an embodiment, the superconducting transmon qubit coupler (as shown in FIGS. 5 and 6) is replaced with, e.g., a meandering coplanar waveguide resonator structure that is configured as an LC resonator for circuit QED. For example, in some embodiments, a first end of the meandering coplanar waveguide resonator structure would be capacitively coupled to the superconducting electrode 516-1 of the capacitor 516 of the first superconducting fluxonium qubit 510, and a second end of the meandering coplanar waveguide resonator structure would be capacitively coupled to the superconducting electrode 526-1 of the capacitor 526 of the second superconducting fluxonium qubit 520, using known capacitive coupling structures and techniques.

Computer simulations were performed to illustrate longitudinal coupling and static ZZ suppression characteristics that can be achieved for a fluxonium-transmon-fluxonium system (FIG. 3), and a fluxonium-resonator-fluxonium system (FIG. 4). The results of such computer simulations are graphically illustrated in FIGS. 7A and 7B for a fluxonium-transmon-fluxonium system (FIG. 3), and graphically illustrated in FIGS. 8A and 8B for a fluxonium-resonator-fluxonium system (FIG. 4). It is to be understood that the computer simulation results shown in FIGS. 7A, 7B, 8A, and 8B are based on exemplary sets of numerical values as presented below, and should not be construed in any limiting manner with regard to the scope of the claimed subject matter.

Figures 7A, 7B:
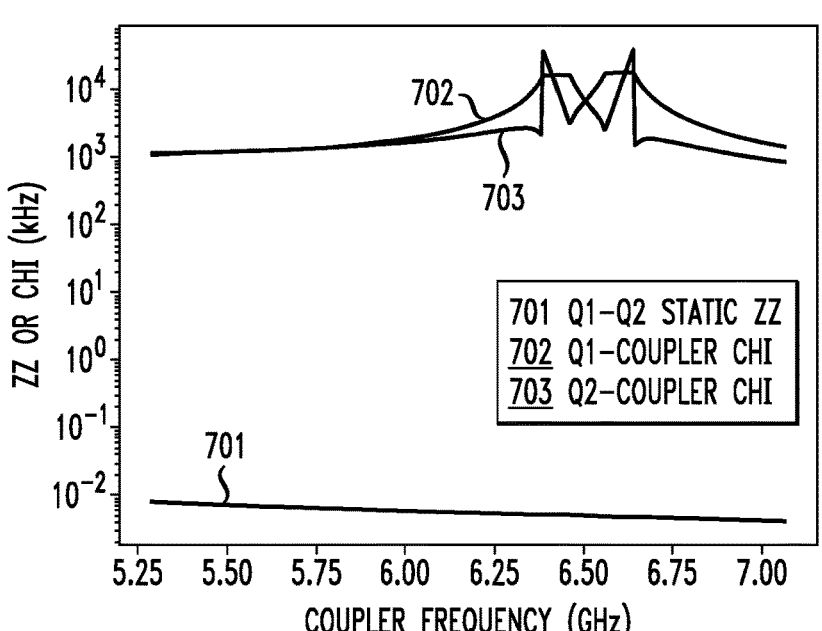
FIGS. 7A and 7B graphically illustrate computer simulations that show longitudinal coupling and static ZZ suppression characteristics for a fluxonium-transmon-fluxonium circuit configuration, according to an exemplary embodiment of the disclosure.

FIG. 7A depicts a graph 700 which illustrates a first curve 701 which depicts a static ZZ interaction (y-axis) between first and second superconducting fluxonium qubits Q1 and Q2 over a range of operating frequencies (x-axis) of a superconducting transmon qubit coupler. In addition, FIG. 7A graphically illustrate a second curve 702 which depicts a longitudinal coupling (denoted Chi) between the first superconducting fluxonium qubit Q1 and the superconducting transmon qubit coupler over the range of operating frequencies (x-axis) of the superconducting transmon qubit coupler, and a third curve 703 which depicts a longitudinal coupling (denoted Chi) between the second superconducting fluxonium qubit Q2 and the superconducting transmon qubit coupler over the range of operating frequencies (x-axis) of the superconducting transmon qubit coupler.

The simulation results in FIG. 7A depict operational characteristics of an example system. The operating frequency of the superconducting transmon qubit coupler was swept from about 5.25 GHz to about 7.25 GHz, while keeping the transition frequencies of the first and second fluxonium qubits Q1 and Q2 fixed at $f_{Q1}$=0.943 GHz and $f_{Q2}$=0.870 GHz, respectively. In addition, the shunt capacitance $C_T$ of the superconducting transmon qubit coupler was selected to achieve an anharmonicity of about −200 MHz. The operating frequency of the superconducting transmon qubit coupler was changed by varying the Josephson junction (e.g., varying the Josephson energy Err) of the superconducting transmon qubit coupler. For the simulation, is it assumed that the first and second superconducting fluxonium qubits Q1 and Q2 are each biased to one-half magnetic flux quantum.

As shown in FIG. 7A, the first curve 701 illustrates that the static ZZ interaction between the first and second fluxonium qubits Q1 and Q2 is significantly suppressed for a wide range of operating frequencies of the superconducting transmon qubit coupler. In addition, the second and third curves 702 and 703 illustrate a relatively large amount of longitudinal coupling between the superconducting transmon qubit coupler and the first and second fluxonium qubits Q1 and Q2, wherein such longitudinal coupling is sufficient to implement an entanglement gate between the first and second fluxonium qubits Q1 and Q2 through mediation of the superconducting transmon qubit coupler, without direct exchange coupling between the first and second fluxonium qubits Q1 and Q2.

Next, FIG. 7B depicts a graph 710 which illustrates a first curve 711 of the static ZZ interaction (y-axis) between the first and second superconducting fluxonium qubits Q1 and Q2 over a range of qubit-qubit frequency detuning ($f_{Q1}$-$f_{Q2}$) from, e.g., −0.23 GHz to +0.075 GHz (x-axis) between the first and second superconducting fluxonium quantum bits Q1 and Q2, while keeping the operating frequency of the superconducting transmon qubit coupler fixed at 6.6 GHz. In addition, FIG. 7B graphically illustrates a second curve 712 which depicts longitudinal coupling (Chi) between the first superconducting fluxonium qubit Q1 and the superconducting transmon qubit coupler over the range of qubit-qubit frequency detuning ($f_{Q1}$-$f_{Q2}$) between the first and second superconducting fluxonium quantum bits Q1 and Q2, while keeping the operating frequency of the superconducting transmon qubit coupler fixed, and a third curve 713 which depicts a longitudinal coupling (Chi) between the second superconducting fluxonium qubit Q2 and the superconducting transmon qubit coupler over the range of qubit-qubit frequency detuning ($f_{Q1}$-$f_{Q2}$) between the first and second superconducting fluxonium quantum bits Q1 and Q2, while keeping the operating frequency of the superconducting transmon qubit coupler fixed.

The simulation results in FIG. 7B were obtained based on the same exemplary set of parameters as discussed above for the simulation results for FIG. 7A, except that the operating frequency of the superconducting transmon qubit coupler was fixed at 6.6 GHz. In addition, the transition frequency of the first fluxonium qubit Q1 was fixed at $f_{Q1}$=0.943 GHz, while the transition frequency of the second superconducting fluxonium qubit Q2 was varied by varying the Josephson energy $E_{J2}$ of the Josephson junction device and the energy $E_{L2}$ of the shunt super-inductor, to thereby vary the qubit-qubit frequency detuning ($f_{Q1}$-$f_{Q2}$).

As shown in FIG. 7B, the first curve 711 illustrates that the static ZZ interaction between the first and second fluxonium qubits Q1 and Q2 is significantly suppressed over the simulated range of qubit-qubit frequency detuning ($f_{Q1}$-$f_{Q2}$). In addition, the second and third curves 712 and 713 illustrate a relatively large amount of longitudinal coupling between the superconducting transmon qubit coupler and the first and second fluxonium qubits Q1 and Q2 over the simulated range of qubit-qubit frequency detuning ($f_{Q1}$-$f_{Q2}$), wherein such longitudinal coupling is sufficient to implement a entanglement gate between the first and second fluxonium qubits Q1 and Q2 through mediation of the superconducting transmon qubit coupler, without direct exchange coupling between the first and second fluxonium qubits Q1 and Q2.

Figure 8A:
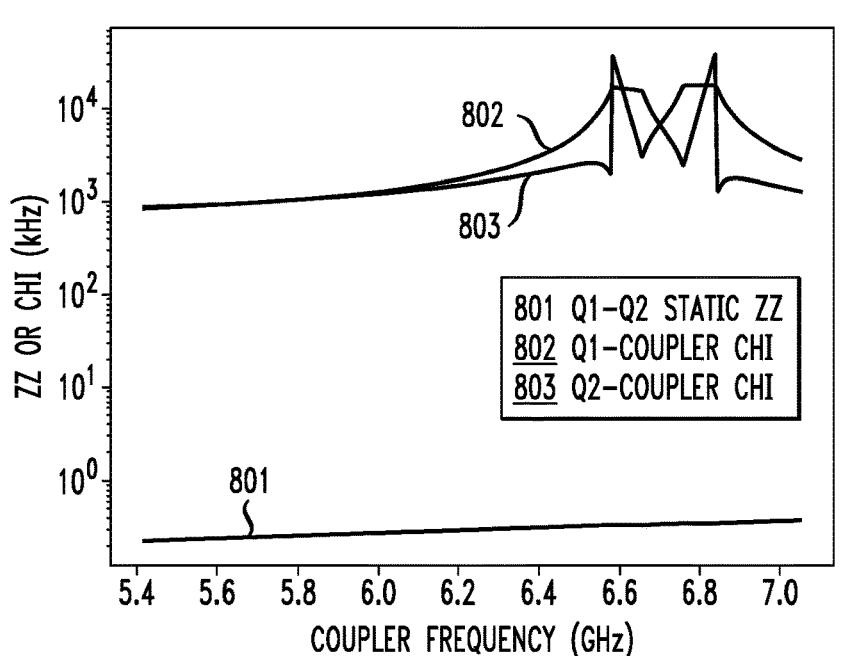
FIGS. 8A and 8B graphically illustrate computer simulations that show longitudinal coupling and static ZZ suppression characteristics for a fluxonium-LC resonator-fluxonium circuit configuration, according to an exemplary embodiment of the disclosure.

Next, FIG. 8A depicts a graph 800 which illustrates a first curve 801 of the static ZZ interaction (y-axis) between first and second superconducting fluxonium qubits Q1 and Q2 over a range of operating frequencies (x-axis) of a superconducting LC resonator coupler. In addition, FIG. 8A graphically illustrate a second curve 802 which depicts longitudinal coupling (Chi) between the first superconducting fluxonium qubit Q1 and the superconducting LC resonator coupler over the range of operating frequencies (x-axis) of the superconducting LC resonator coupler, and a third curve 803 which depicts a longitudinal coupling (Chi) between the second superconducting fluxonium qubit Q2 and the superconducting LC resonator coupler over the range of operating frequencies (x-axis) of the superconducting LC resonator coupler.

The simulation results in FIG. 8A were obtained based the same exemplary set of parameters as discussed above for the simulation results for FIG. 7A with regard to the first and second fluxonium qubits Q1 and Q2, where the operating (resonant) frequency of the superconducting LC resonator coupler was swept from about 5.4 GHz to about 7.25 GHz, while keeping the transition frequencies of the first and second fluxonium qubits Q1 and Q2 fixed at $f_{Q1}$=0.943 GHz and $f_{Q2}$=0.870 GHz, respectively. In addition, for purposes of comparison with the simulation results of FIG. 7A, the coupling capacitance of the coupling capacitors between the superconducting LC resonator coupler and the first and second superconducting fluxonium qubits Q1 and Q2 was adjusted to achieve an equivalent exchange coupling energy J=57 MHz between the superconducting LC resonator coupler and the first and second superconducting fluxonium qubits Q1 and Q2.

As shown in FIG. 8A, the first curve 801 illustrates that the static ZZ interaction between the first and second superconducting fluxonium qubits Q1 and Q2 is significantly suppressed for a wide range of operating frequencies of the superconducting LC resonator coupler. In addition, the second and third curves 802 and 803 illustrate a relatively large amount of longitudinal coupling between the superconducting LC resonator coupler and the first and second fluxonium qubits Q1 and Q2, wherein such longitudinal coupling is sufficient to implement a entanglement gate between the first and second fluxonium qubits Q1 and Q2 through mediation of the superconducting LC resonator coupler, without direct exchange coupling between the first and second fluxonium qubits Q1 and Q2.

Figure 8B:
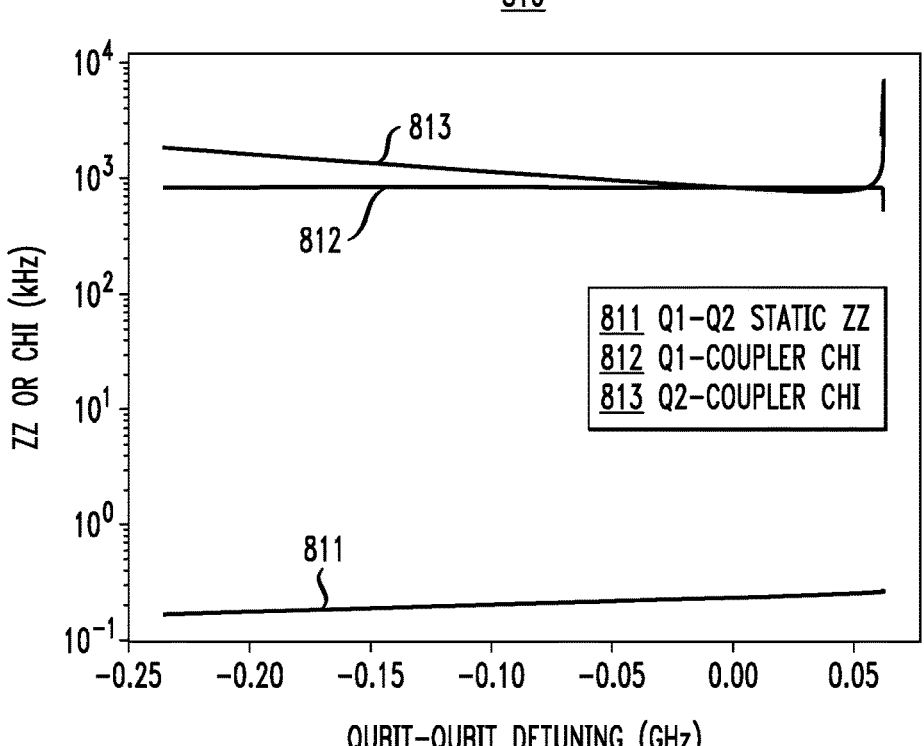

Next, FIG. 8B depicts a graph 810 which graphically illustrates a first curve 811 of the static ZZ interaction (y-axis) between the first and second superconducting fluxonium qubits Q1 and Q2 over a range of qubit-qubit frequency detuning ($f_{Q1}$-$f_{Q2}$) from, e.g., −0.23 GHz to +0.075 GHz (x-axis) between the first and second superconducting fluxonium quantum bits Q1 and Q2, while keeping the operating frequency of the superconducting LC resonator coupler fixed at 6.6 GHz. In addition, FIG. 8B graphically illustrates a second curve 812 which depicts longitudinal coupling (Chi) between the first superconducting fluxonium qubit Q1 and the superconducting LC resonator coupler over the range of qubit-qubit frequency detuning ($f_{Q1}$-$f_{Q2}$) between the first and second superconducting fluxonium quantum bits Q1 and Q2, while keeping the operating frequency of the superconducting LC resonator coupler, and a third curve 813 which depicts a longitudinal coupling (Chi) between the second superconducting fluxonium qubit Q2 and the superconducting LC resonator coupler over the range of qubit-qubit frequency detuning ($f_{Q1}$-$f_{Q2}$) between the first and second superconducting fluxonium quantum bits Q1 and Q2, while keeping the operating frequency of the superconducting LC resonator coupler.

The simulation results in FIG. 8B were obtained based on the same exemplary set of parameters as discussed above for FIG. 7B. As shown in FIG. 8B, the first curve 811 illustrates that the static ZZ interaction between the first and second fluxonium qubits Q1 and Q2 is significantly suppressed over the simulated range of qubit-qubit frequency detuning ($f_{Q1}$-$f_{Q2}$). In addition, the second and third curves 812 and 813 illustrate a relatively large amount of longitudinal coupling between the superconducting LC resonator coupler and the first and second fluxonium qubits Q1 and Q2 over the simulated range of qubit-qubit frequency detuning ($f_{Q1}$-$f_{Q2}$), wherein such longitudinal coupling is sufficient to implement a entanglement gate between the first and second fluxonium qubits Q1 and Q2 through mediation of the superconducting LC resonator coupler, without direct exchange coupling between the first and second fluxonium qubits Q1 and Q2.

Figure 9:
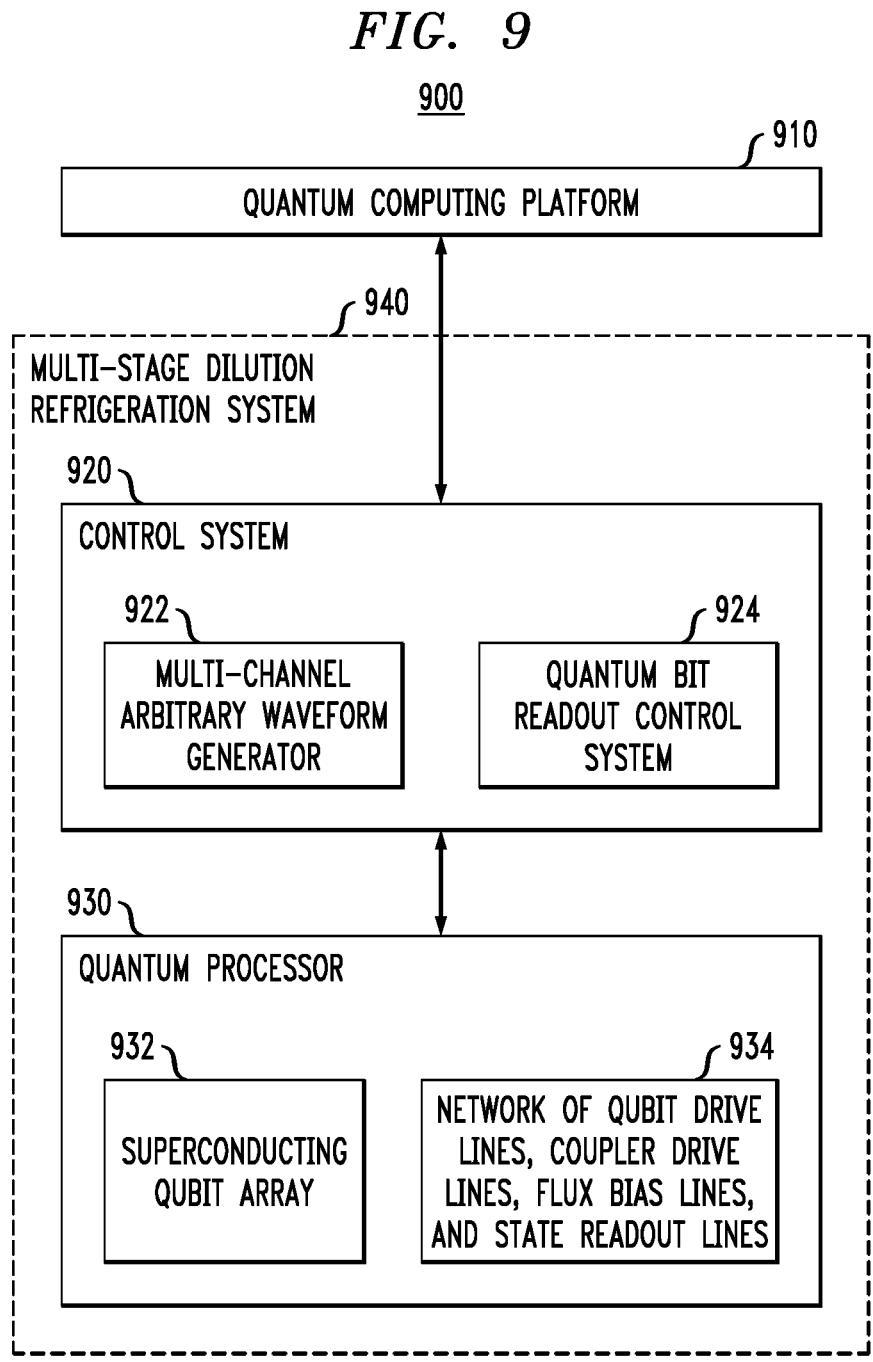
FIG. 9 schematically illustrates a quantum computing system, according to an exemplary embodiment of the disclosure.

FIG. 9 schematically illustrates a quantum computing system, according to an exemplary embodiment of the disclosure. In particular, FIG. 9 schematically illustrates a quantum computing system 900 which comprises a quantum computing platform 910, a control system 920, and a quantum processor 930. In some embodiments, the control system 920 comprises a multi-channel arbitrary waveform generator 922, and a quantum bit readout control system 924. The quantum processor 930 comprises a solid-state semiconductor chip having a superconducting qubit array 932 and a network 934 of qubit drive lines, flux bias lines, coupler drive lines, and qubit state readout lines, and other circuit QED components that may be needed for a given application or quantum system configuration.

In some embodiments, the control system 920 and the quantum processor 930 are disposed in a dilution refrigeration system 940 which can generate cryogenic temperatures that are sufficient to operate components of the control system 920 for quantum computing applications. For example, the quantum processor 930 may need to be cooled down to near-absolute zero, e.g., 10-15 millikelvin (mK), to allow the superconducting qubits to exhibit quantum behaviors. In some embodiments, the dilution refrigeration system 940 comprises a multi-stage dilution refrigerator where the components of the control system 920 can be maintained at different cryogenic temperatures, as needed. For example, while the quantum processor 930 may need to be cooled down to, e.g., 10-15 mK, the circuit components of the control system 920 may be operated at cryogenic temperatures greater than 10-15 mK, depending on the configuration of the quantum computing system.

In some embodiments, the superconducting qubit array 932 comprises a plurality of superconducting fluxonium qubits, in which pairs of the superconducting fluxonium qubits are connected by respective superconducting coupler circuitry, e.g., a superconducting transmon qubit coupler, or a superconducting LC resonator, using techniques as discussed herein. As noted above, the superconducting coupler circuitry is configured to control interactions between spatially separated pairs of superconducting qubits to implement entanglement gate operations. The number of superconducting qubits of the qubit array 932 can be on the order of tens, hundreds, thousands, etc.

The network 934 of qubit drive lines, flux bias lines, coupler drive lines, and qubit state readout lines, are configured to applying microwave control signals to superconducting qubits and coupler circuitry in the superconducting qubit array 932 to perform various type of gate operations, e.g., single-gate operations, entanglement gate operations (e.g., CPHASE gate operation), etc., as well read the quantum states of the superconducting qubits. More specifically, as noted above, the flux bias lines are utilized to apply a magnetic flux to respective superconducting qubits to tune/change the operating frequencies (e.g., transition frequencies) of the superconducting qubits for purposes of, e.g., executing certain quantum information processing algorithms. Furthermore, microwave control pulses are applied to the qubit drive lines of respective superconducting qubits to change the quantum state of the superconducting qubits (e.g., change the quantum state of a given qubit between the ground state and excited state, or to a superposition state). In particular, as noted above, the qubit drive line for a given superconducting qubit is utilized to modify the state of the given superconducting qubit by applying a microwave drive pulse with a center frequency that matches the operating frequency of the given superconducting qubit. In addition, microwave control pulses are applied to the coupler drive lines to "activate" the coupler circuits to perform entanglement gate operations between pairs of coupled superconducting qubits, when executing certain quantum information processing algorithms.

Furthermore, as noted above, the state readout lines comprise readout resonators that are coupled to respective superconducting qubits. The state of a given superconducting qubit can be determined through microwave transmission measurements made between readout ports of the readout resonator. The states of the superconducting qubits are read out after executing a quantum algorithm. In some embodiments, a dispersive readout operation is performed in which a change in the resonant frequency of a given readout resonator, which is coupled to a given superconducting qubit, is utilized to readout the state (e.g., ground or excited state) of the given superconducting qubit.

The network 934 of qubit drive lines, flux bias lines, coupler drive lines, and qubit state readout lines, etc., is coupled to the control system 920 through a suitable hardware input/output (I/O) interface, which couples I/O signals between the control system 920 and the quantum processor 930. For example, the hardware I/O interface may comprise various types of hardware and components, such as RF cables, wiring, RF elements, optical fibers, heat exchanges, filters, amplifiers, isolators, etc.

In some embodiments, the multi-channel arbitrary waveform generator (AWG) 922 and other suitable microwave pulse signal generators are configured to generate the microwave control pulses that are applied to the qubit drive lines, the flux bias lines, and the coupler drive lines to control the operation of the superconducting qubits and associated qubit coupler circuitry, when performing various gate operations to execute a given certain quantum information processing algorithm. In some embodiments, the multi-channel AWG 922 comprises a plurality of AWG channels, which control respective superconducting qubits within the superconducting qubit array 932 of the quantum processor 930. In some embodiments, each AWG channel comprises a baseband signal generator, a digital-to-analog converter (DAC) stage, a filter stage, a modulation stage, and an impedance matching network, and a phase-locked loop system to generate local oscillator (LO) signals (e.g., quadrature LO signals LO_I and LO_Q) for the respective modulation stages of the respective AWG channels.

In some embodiments, the multi-channel AWG 922 comprises a quadrature AWG system which is configured to process quadrature signals, wherein a quadrature signal comprises an in-phase (I) signal component, and a quadrature-phase (Q) signal component. In each AWG channel the baseband signal generator, is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I(t) and Q(t)) having a baseband frequency. The filter stage for the given AWG channel is configured to the filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I(t) and Q(t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

In some embodiments, the quantum bit readout control system 924 comprises a microwave pulse signal generator that is configured to applying a microwave tone to a given readout resonator line of a given superconducting qubit to perform a readout operation to readout the state of the given superconducting qubit, as well as circuitry that is configured to process the readout signal generated by the readout resonator line to determine the state of the given superconducting qubit, using techniques known to those of ordinary skill in the art.

The quantum computing platform 910 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), etc. In addition, the quantum computing platform 910 comprises a hardware architecture of processors, memory, etc., which is configured to control the execution of quantum applications, and interface with the control system 920 to (i) generate digital control signals that are converted to analog microwave control signals by the control system 920, to control operations of the quantum processor 930 when executing a given quantum application, and (ii) to obtain and process digital signals received from the control system 920, which represent the processing results generated by the quantum processor 930 when executing various gate operations for a given quantum application.

Figure 10:
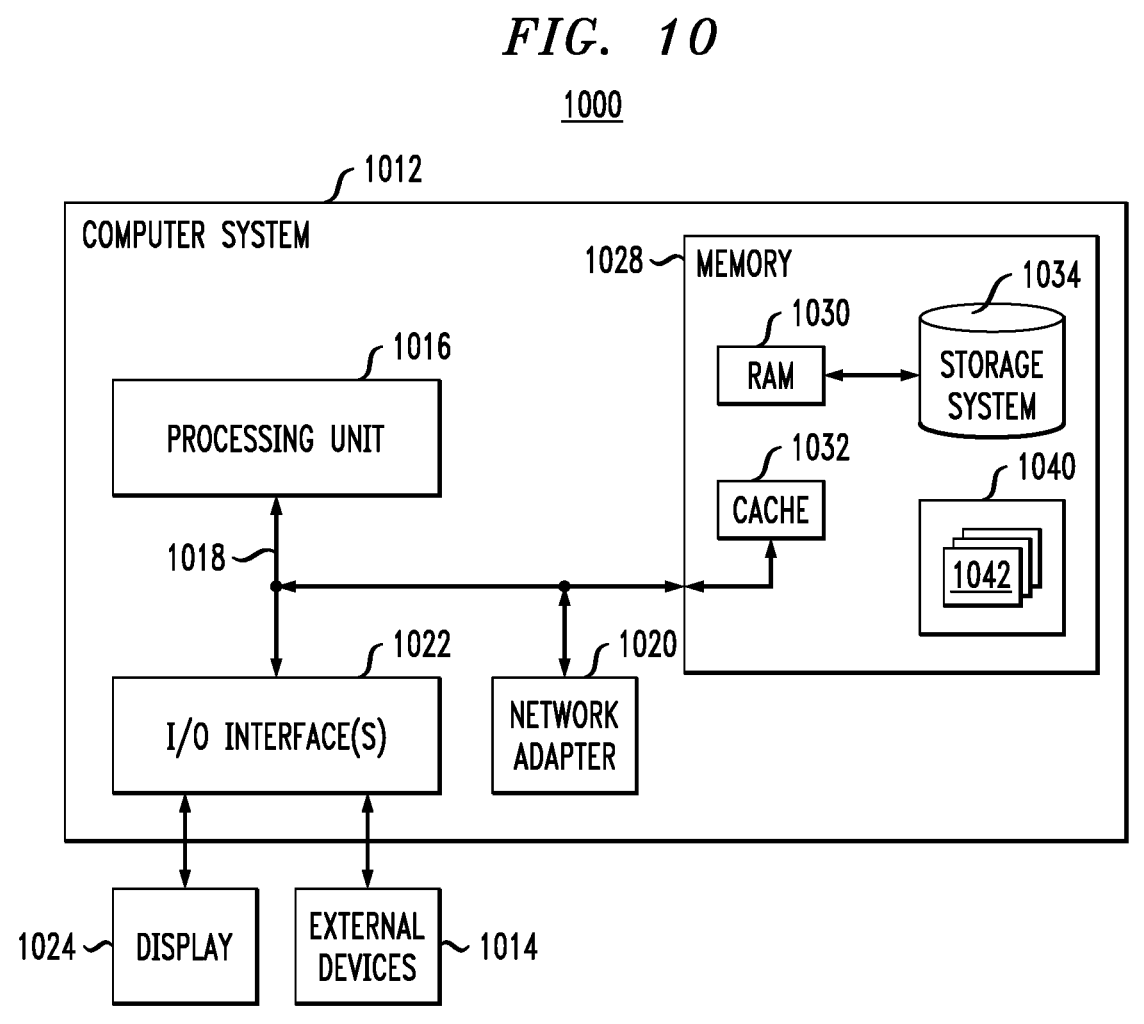

In some exemplary embodiments, the quantum computing platform 910 of the quantum computing system 900 may be implemented using any suitable computing system architecture (e.g., as shown in FIG. 10) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations as discussed herein may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform various operations as discussed herein.

The computer readable program instructions may be provided to a processor of a computer, or other programmable data processing apparatus to produce a machine, such that the instructions, which execute via the processor of the computer or other programmable data processing apparatus, create means for implementing the functions/acts as discussed herein. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement the exemplary computing operations as discussed herein.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts as discussed herein.

The block diagrams in the Figures illustrate the architecture, functionality, and operation of possible implementations of systems, methods, and computer program products according to various embodiments of the present invention. In this regard, each block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and combinations of blocks in the block diagrams, can be implemented by special purpose hardware-based systems that perform the specified functions or acts or carry out combinations of special purpose hardware and computer instructions.

These concepts are illustrated with reference to FIG. 10 which schematically illustrates an exemplary architecture of a computing node which can host a quantum computing platform, according to an exemplary embodiment of the disclosure. For example, FIG. 10 schematically illustrates an exemplary architecture of a computing node 1000 which can host the quantum computing platform 910 (FIG. 9), according to an exemplary embodiment of the disclosure. More specifically, FIG. 10 illustrates a computing node 1000 which comprises a computer system/server 1012, which is operational with numerous other general purpose or special purpose computing system environments or configurations. Examples of well-known computing systems, environments, and/or configurations that may be suitable for use with computer system/server 1012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1012 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1012 may be practiced in distributed cloud computing environments where tasks are performed by remote processing devices that are linked through a communications network. In a distributed cloud computing environment, program modules may be located in both local and remote computer system storage media including memory storage devices.

In FIG. 10, computer system/server 1012 in computing node 1000 is shown in the form of a general-purpose computing device. The components of computer system/server 1012 may include, but are not limited to, one or more processors or processing units 1016, a system memory 1028, and a bus 1018 that couples various system components including system memory 1028 to the processors 1016.

The bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1012 typically includes a variety of computer system readable media. Such media may be any available media that is accessible by computer system/server 1012, and it includes both volatile and non-volatile media, removable and non-removable media.

The system memory 1028 can include computer system readable media in the form of volatile memory, such as random-access memory (RAM) 1030 and/or cache memory 1032. The computer system/server 1012 may further include other removable/non-removable, volatile/nonvolatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1018 by one or more data media interfaces. As depicted and described herein, memory 1028 may include at least one program product having a set (e.g., at least one) of program modules that are configured to carry out the functions of embodiments of the invention.

The program/utility 1040, having a set (at least one) of program modules 1042, may be stored in memory 1028 by way of example, and not limitation, as well as an operating system, one or more application programs, other program modules, and program data. Each of the operating system, one or more application programs, other program modules, and program data or some combination thereof, may include an implementation of a networking environment. Program modules 1042 generally carry out the functions and/or methodologies of embodiments of the disclosure as described herein.

Computer system/server 1012 may also communicate with one or more external devices 1014 such as a keyboard, a pointing device, a display 1024, etc., one or more devices that enable a user to interact with computer system/server 1012, and/or any devices (e.g., network card, modem, etc.) that enable computer system/server 1012 to communicate with one or more other computing devices. Such communication can occur via Input/Output (I/O) interfaces 1022. Still yet, computer system/server 1012 can communicate with one or more networks such as a local area network (LAN), a general wide area network (WAN), and/or a public network (e.g., the Internet) via network adapter 1020. As depicted, network adapter 1020 communicates with the other components of computer system/server 1012 via bus 1018. It should be understood that although not shown, other hardware and/or software components could be used in conjunction with computer system/server 1012. Examples, include, but are not limited to: microcode, device drivers, redundant processing units, external disk drive arrays, RAID systems, SSD drives, and data archival storage systems, etc.

In some embodiments, the quantum computing system 900 of FIG. 9 can be implemented in the cloud (quantum computing as a service (QaaS)) to provide quantum compute facilities as an on-demand service. While this disclosure includes a detailed description on cloud computing, implementation of the teachings recited herein are not limited to a cloud computing environment. Rather, embodiments of the disclosure can be implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 11:
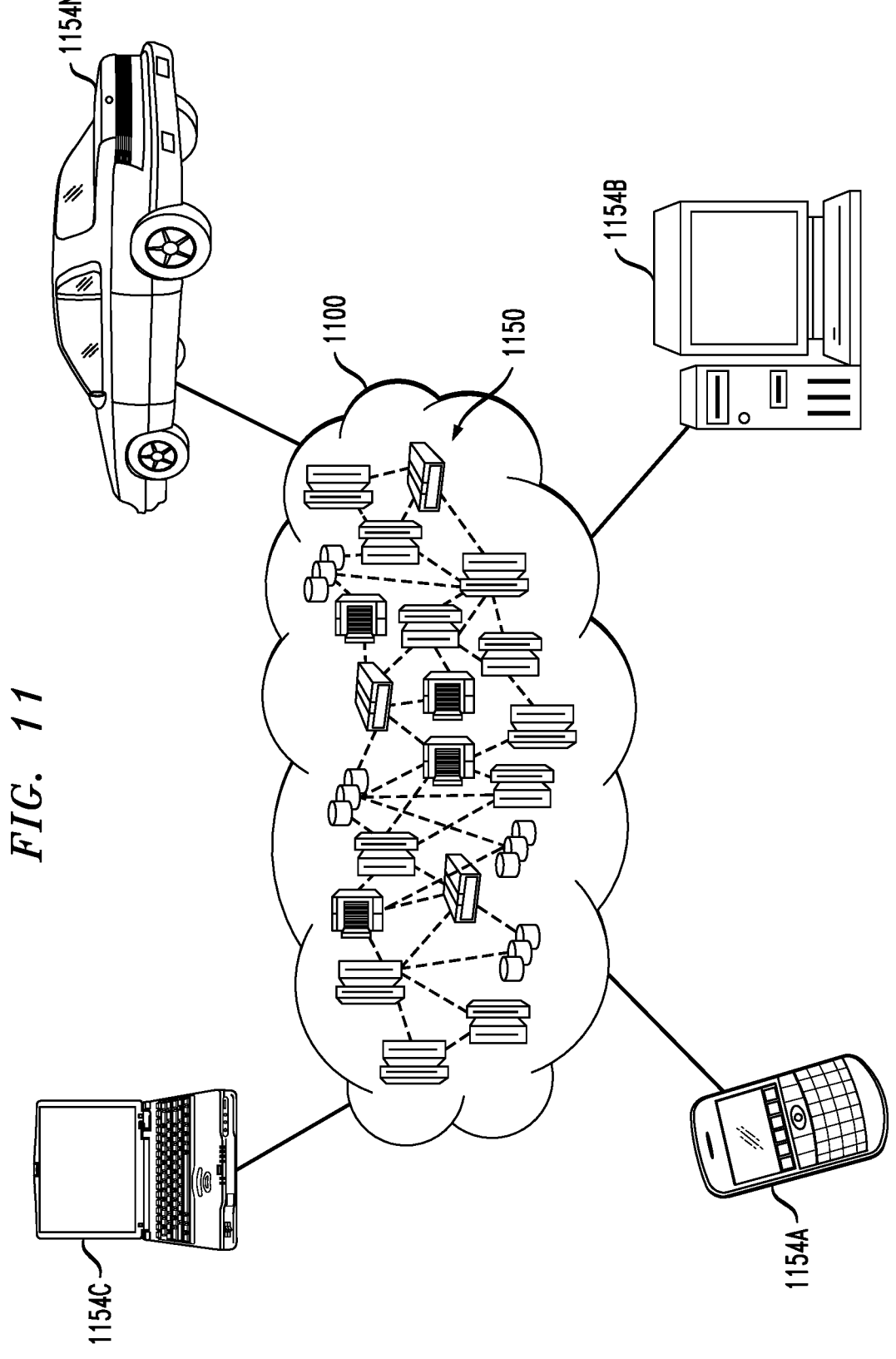
FIG. 11 depicts a cloud computing environment according to an exemplary embodiment of the disclosure.

Referring now to FIG. 11, illustrative cloud computing environment 1100 is depicted. As shown, cloud computing environment 1100 includes one or more cloud computing nodes 1150 with which local computing devices used by cloud consumers, such as, for example, personal digital assistant (PDA) or cellular telephone 1154A, desktop computer 1154B, laptop computer 1154C, and/or automobile computer system 1154N may communicate. Nodes 1150 may communicate with one another. They may be grouped (not shown) physically or virtually, in one or more networks, such as Private, Community, Public, or Hybrid clouds as described hereinabove, or a combination thereof. This allows cloud computing environment 1100 to offer infrastructure, platforms and/or software as services for which a cloud consumer does not need to maintain resources on a local computing device. It is understood that the types of computing devices 1154A-N shown in FIG. 11 are intended to be illustrative only and that computing nodes 1150 and cloud computing environment 1100 can communicate with any type of computerized device over any type of network and/or network addressable connection (e.g., using a web browser).

Figure 12:
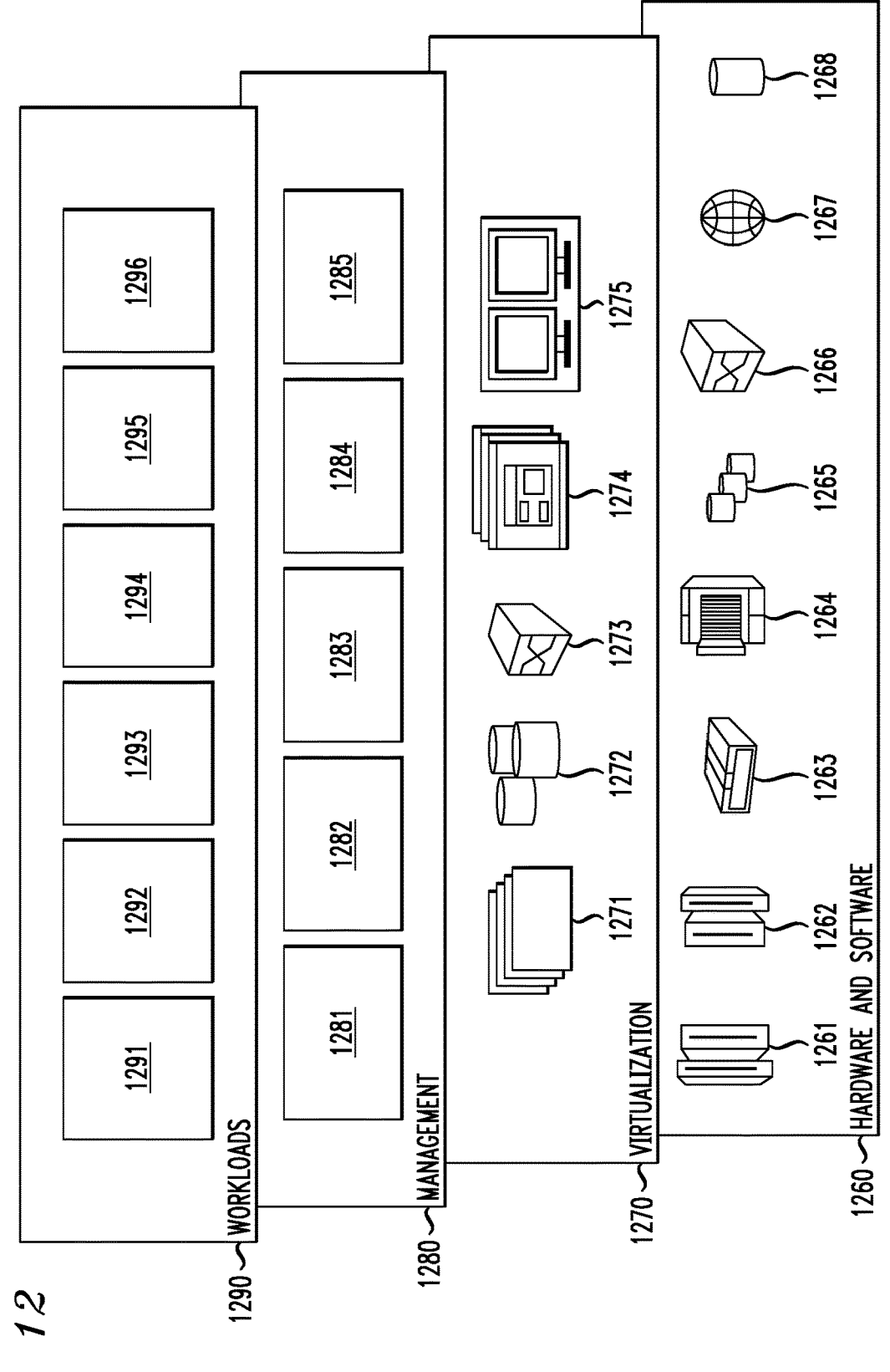
FIG. 12 depicts abstraction model layers according to an exemplary embodiment of the disclosure.

Referring now to FIG. 12, a set of functional abstraction layers provided by cloud computing environment 1100 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 1260 includes hardware and software components. Examples of hardware components include: mainframes 1261; RISC (Reduced Instruction Set Computer) architecture based servers 1262; servers 1263; blade servers 1264; storage devices 1265; and networks and networking components 1266. In some embodiments, software components include network application server software 1267 and database software 1268.

Virtualization layer 1270 provides an abstraction layer from which the following examples of virtual entities may be provided: virtual servers 1271; virtual storage 1272; virtual networks 1273, including virtual private networks; virtual applications and operating systems 1274; and virtual clients 1275.

In one example, management layer 1280 may provide the functions described below. Resource provisioning 1281 provides dynamic procurement of computing resources and other resources that are utilized to perform tasks within the cloud computing environment. Metering and Pricing 1282 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1283 provides access to the cloud computing environment for consumers and system administrators. Service level management 1284 provides cloud computing resource allocation and management such that required service levels are met. Service Level Agreement (SLA) planning and fulfillment 1285 provide pre-arrangement for, and procurement of, cloud computing resources for which a future requirement is anticipated in accordance with an SLA.

Workloads layer 1290 provides examples of functionality for which the cloud computing environment may be utilized. Examples of workloads and functions which may be provided from this layer include: mapping and navigation 1291; software development and lifecycle management 1292; virtual classroom education delivery 1293; data analytics processing 1294; transaction processing 1295; and various functions 1296 for implementing a quantum computing platform of a quantum computing system, such as discussed herein in conjunction with FIG. 9. In some embodiments, the hardware and software layer 1260 would include, e.g., various software and hardware systems of, e.g., the quantum computing system 900 (FIG. 9) as discussed herein, to implement or otherwise support the various workloads and functions 1296 for performing, e.g., quantum computing operations and executing quantum computing applications.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a first superconducting quantum bit comprising a superconducting tunnel junction and a shunt inductor which form a first superconducting loop;
a second superconducting quantum bit comprising a superconducting tunnel junction and a shunt inductor which form a second superconducting loop; and
a coupler circuit which comprises a capacitor and an inductive element coupled in parallel between a first node and a second node, with the first superconducting quantum bit coupled to the first node and the second superconducting quantum bit coupled to the second node;
wherein the coupler circuit is configured to implement an entanglement gate operation between the first superconducting quantum bit and the second superconducting quantum bit through exchange interactions between the coupler circuit and the first superconducting quantum bit and the second superconducting quantum bit, when the coupler circuit is driven by a microwave control signal having a frequency which corresponds to an operating frequency of the coupler circuit; and
wherein the coupler circuit is configured to suppress interaction between the first superconducting quantum bit and the second superconducting quantum bit, when the coupler circuit is not driven by the microwave control signal.

2. The device of claim 1, wherein the first superconducting quantum bit and the second superconducting quantum bit each comprise a superconducting fluxonium quantum bit.

3. The device of claim 1, further comprising a drive control line, which is one of capacitively and inductively coupled to the coupler circuit, and configured to apply the microwave control signal to the coupler circuit.

4. The device of claim 1, wherein:
the coupler circuit comprises a superconducting resonator circuit; and
the inductive element comprises a superconducting inductor coupled in parallel with the capacitor between the first node and the second node of the coupler circuit.

5. The device of claim 1, wherein:
the coupler circuit comprises a third superconducting quantum bit; and
the inductive element comprises a superconducting tunnel junction coupled in parallel with the capacitor between the first node and the second node of the coupler circuit.

6. The device of claim 5, wherein the third superconducting quantum bit comprises a superconducting transmon quantum bit.

7. The device of claim 5, wherein the superconducting tunnel junction comprises a Josephson junction.

8. The device of claim 5, wherein:
the first superconducting quantum bit is configured to have a first transition frequency;
the second superconducting quantum bit is configured to have a second transition frequency; and
the third superconducting quantum bit comprises a third transition frequency, which is detuned from, and greater than, the first transition frequency and the second transition frequency.

9. The device of claim 1, further comprising:
a first flux bias control line coupled to the first superconducting loop, and configured to apply a first flux bias control signal to adjust a transition frequency of the first superconducting quantum bit; and
a second flux bias control line coupled to the second superconducting loop, and configured to apply a second flux bias control signal to adjust a transition frequency of the second superconducting quantum bit;
wherein the entanglement gate operation is implemented by the first flux bias control signal applying about one-half magnetic flux quantum to the first superconducting loop of the first superconducting quantum bit, and the second flux bias control signal applying about one-half magnetic flux quantum to the second superconducting loop of the second superconducting quantum bit.

10. A system, comprising:
a quantum processor comprising an array of superconducting quantum bits; and
a control system configured to generate control signals to control the quantum processor;
wherein the array of superconducting quantum bits comprises:
a first superconducting quantum bit comprising a superconducting tunnel junction and a shunt inductor which form a first superconducting loop;
a second superconducting quantum bit comprising a superconducting tunnel junction and a shunt inductor which form a second superconducting loop; and
a coupler circuit which comprises a capacitor and an inductive element coupled in parallel between a first node and a second node, with the first superconducting quantum bit coupled to the first node and the second superconducting quantum bit coupled to the second node;
wherein the coupler circuit is configured to implement an entanglement gate operation between the first superconducting quantum bit and the second superconducting quantum bit through exchange interactions between the coupler circuit and the first superconducting quantum bit and the second superconducting quantum bit, when the coupler circuit is driven by a microwave control signal that is generated by the control system, the microwave control signal having a frequency which corresponds to an operating frequency of the coupler circuit; and
wherein the coupler circuit is configured to suppress interaction between the first superconducting quantum bit and the second superconducting quantum bit, when the coupler circuit is not driven by the microwave control signal.

11. The system of claim 10, wherein the first superconducting quantum bit and the second superconducting quantum bit each comprise a superconducting fluxonium quantum bit.

12. The system of claim 10, wherein:
the coupler circuit comprises a superconducting resonator circuit; and
the inductive element comprises a superconducting inductor coupled in parallel with the capacitor between the first node and the second node of the coupler circuit.

13. The system of claim 10, wherein:
the coupler circuit comprises a third superconducting quantum bit; and
the inductive element comprises a superconducting tunnel junction coupled in parallel with the capacitor between the first node and the second node of the coupler circuit.

14. The system of claim 13, wherein the third superconducting quantum bit comprises a superconducting transmon quantum bit.

15. The system of claim 13, wherein: the superconducting tunnel junction comprises a Josephson junction.

16. The system of claim 10, wherein the quantum processor further comprises:
a first flux bias control line coupled to the first superconducting loop, and configured to apply a first flux bias control signal to adjust a transition frequency of the first superconducting quantum bit; and
a second flux bias control line coupled to the second superconducting loop, and configured to applying a second flux bias control signal to adjust a transition frequency of the second superconducting quantum bit;
wherein the entanglement gate operation is implemented by the control system generating the first flux bias control signal to apply about one-half magnetic flux quantum to the first superconducting loop of the first superconducting quantum bit, and generating the second flux bias control signal to apply about one-half magnetic flux quantum to the second superconducting loop of the second superconducting quantum bit.

17. A device comprising a first superconducting fluxonium quantum bit and a second superconducting fluxonium quantum bit coupled by a coupler circuit which is driven by a microwave control signal having a frequency which corresponds to an operating frequency of the coupler circuit, to control an interaction between the first superconducting fluxonium quantum bit and the second superconducting fluxonium quantum bit, wherein:
the coupler circuit comprises a superconducting resonator circuit comprising a superconducting inductor and a capacitor coupled in parallel between a first node and a second node of the coupler circuit;
the first superconducting fluxonium quantum bit is coupled to the first node of the coupler circuit; and
the second superconducting fluxonium quantum bit is coupled to the second node of the coupler circuit.

18. A device comprising a first superconducting fluxonium quantum bit and a second superconducting fluxonium quantum bit coupled by a coupler circuit which is driven by a microwave control signal having a frequency which corresponds to an operating frequency of the coupler circuit, to control an interaction between the first superconducting fluxonium quantum bit and the second superconducting fluxonium quantum bit, wherein:
the coupler circuit comprises a superconducting quantum bit comprising a superconducting tunnel junction and a capacitor coupled in parallel between a first node and a second node of the coupler circuit;
the superconducting quantum bit is configured as a coupling bus between the first superconducting fluxonium quantum bit and the second superconducting fluxonium quantum bit;

the first superconducting fluxonium quantum bit is coupled to the first node of the coupler circuit; and the second superconducting fluxonium quantum bit is coupled to the second node of the coupler circuit.

19. The device of claim 17, further comprising:

a first flux bias control line coupled to the first superconducting fluxonium quantum bit, and configured to apply a first flux bias control signal to adjust a transition frequency of the first superconducting fluxonium quantum bit; and a second flux bias control line coupled to the second superconducting fluxonium quantum bit, and configured to apply a second flux bias control signal to adjust a transition frequency of the second superconducting fluxonium quantum bit;

wherein an entanglement gate operation is implemented by the first flux bias control signal applying about one-half magnetic flux quantum to the first superconducting fluxonium quantum bit, the second flux bias control signal applying about one-half magnetic flux quantum to the second superconducting fluxonium quantum bit, and driving the coupler circuit with the microwave control signal.

20. The device of claim 18, further comprising:

a first flux bias control line coupled to the first superconducting fluxonium quantum bit, and configured to apply a first flux bias control signal to adjust a transition frequency of the first superconducting fluxonium quantum bit; and a second flux bias control line coupled to the second superconducting fluxonium quantum bit, and configured to apply a second flux bias control signal to adjust a transition frequency of the second superconducting fluxonium quantum bit;

wherein an entanglement gate operation is implemented by the first flux bias control signal applying about one-half magnetic flux quantum to the first superconducting fluxonium quantum bit, the second flux bias control signal applying about one-half magnetic flux quantum to the second superconducting fluxonium quantum bit, and driving the coupler circuit with the microwave control signal.

* * * * *